US012660266B2

(12) United States Patent
More et al.

(10) Patent No.: US 12,660,266 B2
(45) Date of Patent: Jun. 16, 2026

(54) PROFILE CONTROL OF EPITAXIAL STRUCTURES IN SEMICONDUCTOR DEVICES

(71) Applicant: Taiwan Semiconductor Manufacturing Company, Ltd., Hsinchu (TW)

(72) Inventors: Shahaji B. More, Hsinchu (TW); Yi Hsuan Lo, Yunlin (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 465 days.

(21) Appl. No.: 18/128,051

(22) Filed: Mar. 29, 2023

(65) Prior Publication Data

US 2024/0096959 A1 Mar. 21, 2024

Related U.S. Application Data

(60) Provisional application No. 63/375,866, filed on Sep. 16, 2022.

(51) Int. Cl.
| | |
|---|---|
| *H10D 62/13* | (2025.01) |
| *H10D 62/17* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 62/151* (2025.01); *H10D 62/364* (2025.01); *H10D 84/017* (2025.01); *H10D 84/038* (2025.01); *H10D 84/853* (2025.01)

(58) Field of Classification Search
CPC .... H10D 62/151; H10D 62/364; H10D 30/43; H10D 84/0167; H10D 84/0158; H10D 84/0193
See application file for complete search history.

(56) References Cited

U.S. PATENT DOCUMENTS

| | | | |
|---|---|---|---|
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |

(Continued)

*Primary Examiner* — Fernando L Toledo
*Assistant Examiner* — Adam S Bowen
(74) *Attorney, Agent, or Firm* — Sterne, Kessler, Goldstein & Fox P.L.L.C.

(57) ABSTRACT

A semiconductor device and a method of fabricating the semiconductor device are disclosed. The semiconductor device includes a substrate, a first FET, and a second FET. The first FET includes first and second fin structures disposed on first and second fin bases, respectively, a first S/D region disposed on the first and second fin bases and in contact with side surfaces of the first and second fin structures, and a first pair of spacers disposed on opposite sidewalls of the first S/D region. The second FET includes third and fourth fin structures disposed on third and fourth fin bases, respectively, a second S/D region disposed on the third and fourth fin structures, and a second pair of spacers disposed on opposite sidewalls of the second S/D region. A height of the first pair of spacers is greater than a height of the second pair of spacers.

20 Claims, 21 Drawing Sheets

(56)  References Cited

U.S. PATENT DOCUMENTS

|  |  |  |  |
|---|---|---|---|
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2019/0157155 A1* | 5/2019 | Keng | H10D 84/834 |
| 2021/0098304 A1 | 4/2021 | Chang et al. | |
| 2021/0193816 A1* | 6/2021 | Chu | H10D 84/0193 |
| 2021/0257482 A1 | 8/2021 | Chu et al. | |
| 2022/0254882 A1 | 8/2022 | Chiang et al. | |

* cited by examiner

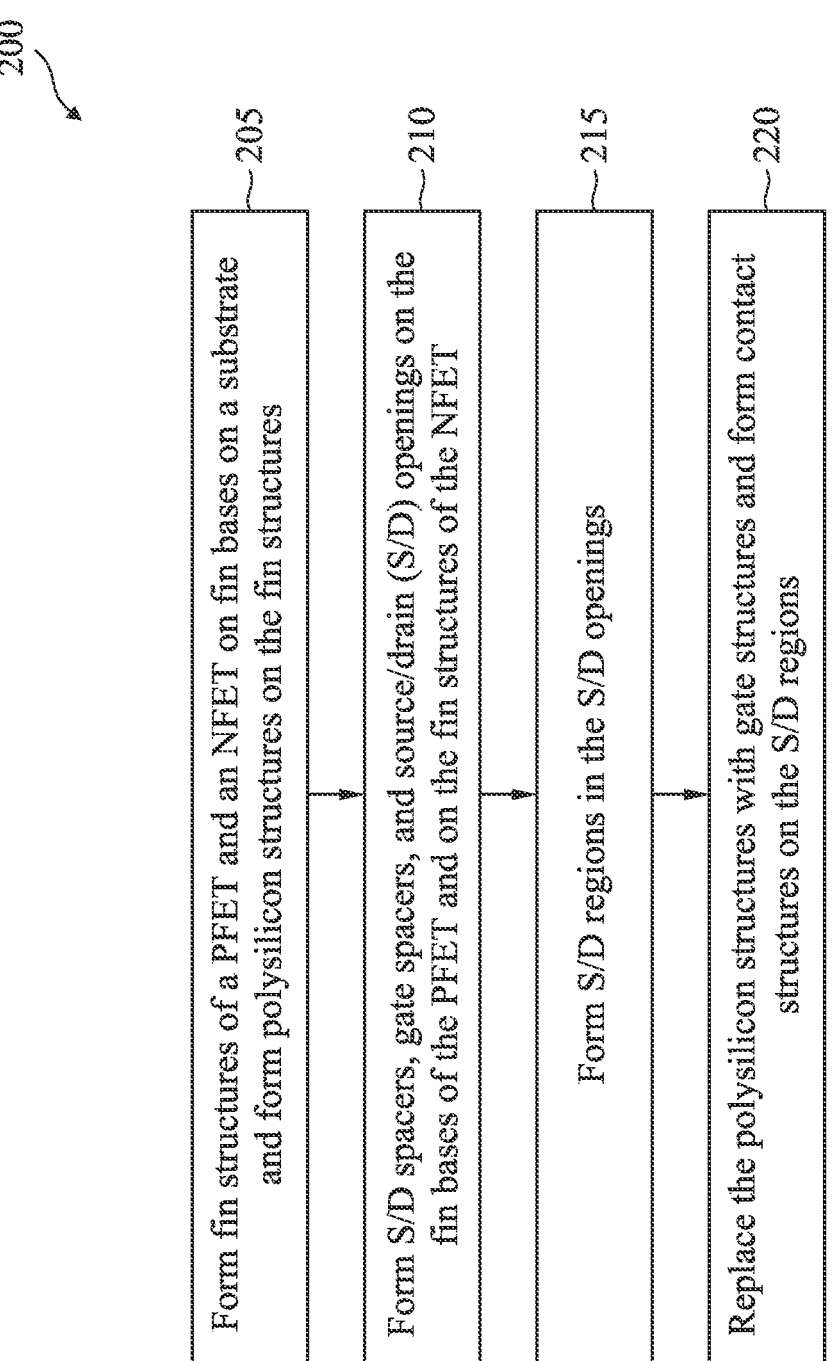

200

205  Form fin structures of a PFET and an NFET on fin bases on a substrate and form polysilicon structures on the fin structures 210  Form S/D spacers, gate spacers, and source/drain (S/D) openings on the fin bases of the PFET and on the fin structures of the NFET 215  Form S/D regions in the S/D openings 220  Replace the polysilicon structures with gate structures and form contact structures on the S/D regions

PROFILE CONTROL OF EPITAXIAL STRUCTURES IN SEMICONDUCTOR DEVICES

CROSS-REFERENCE TO RELATED APPLICATION

This application claims the benefit of U.S. Provisional Patent Application No. 63/375,866, titled "Profile Control of Epitaxial Structures in Semiconductor Devices," filed Sep. 16, 2022, which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 2 is a flow diagram of a method for fabricating a semiconductor device, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
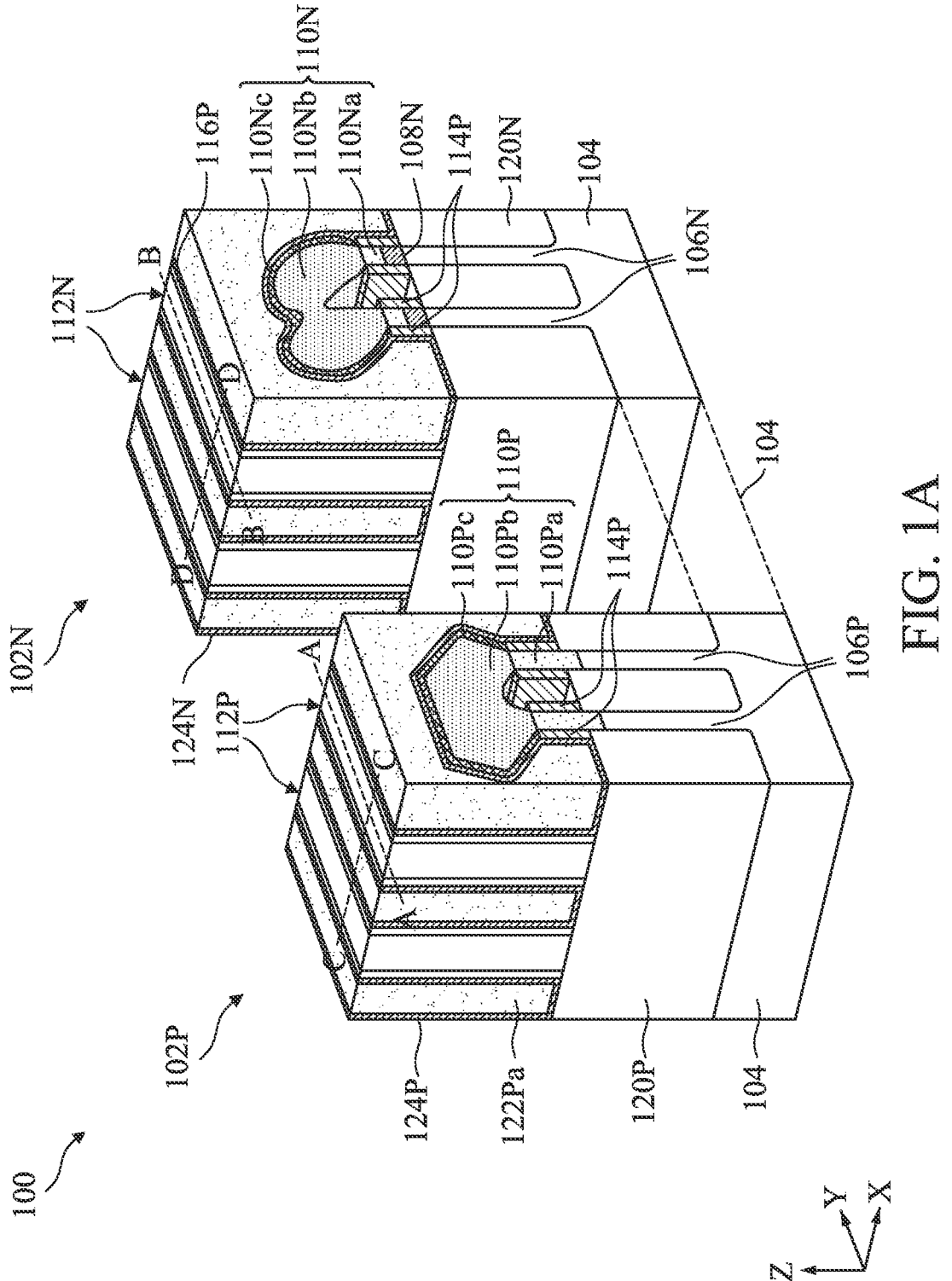
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The profiles of epitaxial source/drain (S/D) regions of FETs can affect the device performance. For example, the S/D regions with larger top surfaces can reduce contact resistances between the S/D regions and contact structures, thus improving device performance. However, epitaxially growing S/D regions with larger top surfaces can increase the challenges of controlling the lateral growth of the S/D regions, thus increasing the challenges of preventing adjacent S/D regions from merging. Furthermore, due to the different S/D region profiles of n-type FETs (NFETs) and p-type FETs (PFETs), epitaxially growing the n- and p-type S/D regions with substantially similar heights can further increase the challenges of epitaxially growing S/D regions with larger top surfaces. The n- and p-type S/D regions with dissimilar heights can increase the complexity of fabricating contact structures on the n- and p-type S/D regions during the same fabrication step.

The present disclosure provides example semiconductor devices (e.g., finFETs, GAA FETs) with PFETs and NFETs having p-type and n-type S/D regions, respectively, of substantially similar heights and larger dimensions. The present disclosure also provides example methods to fabricate the semiconductor devices. In some embodiments, the PFET can include a diamond-shaped p-type S/D region disposed on a fin base and the NFET can include an oval-shaped n-type S/D region disposed on another fin base. In some embodiments, the PFET and NFET can include merged p- and n-type S/D regions disposed on a pair of fin bases, respectively. The p- and n-type S/D regions can be formed with top surfaces at substantially similar heights from the substrate of the semiconductor device. In some embodiments, the height difference between the top surfaces of the p- and n-type S/D regions can be equal to or less than about 5 nm.

In some embodiments, the p-type S/D region can be formed with a width of about 55 nm to about 70 nm and the n-type S/D region can be formed with a width of about 60 nm to about 75 nm for adequate electrical contact between the top surfaces and the contact structures on the p- and n-type S/D regions. To achieve similar device characteristics (e.g., similar threshold voltages) in the PFET and NFET, the width of the n-type S/D region can be formed greater than that of the p-type S/D region. In some embodiments, the ratio of the widths of the n- and p-type S/D regions can be about 1.1 to about 2. In some embodiments, the widths of the merged S/D regions can depend on the spacings between the underlying pairs of fin bases. For example, to form the wider merged n-type S/D region, the fin bases under the merged n-type S/D region can be spaced apart at a distance greater than that between the fin bases under the merged p-type S/D region.

In some embodiments, the PFET and NFET can further include S/D spacers formed along sidewalls of the S/D regions. The S/D spacers can include a dielectric material and can control the height and lateral epitaxial growth of the S/D regions. In some embodiments, the S/D spacers can limit the lateral epitaxial growth ("lateral extension") on each side of the S/D regions to a lateral dimension of about 10 nm to about 20 nm to prevent the S/D regions from merging with adjacent S/D regions during their epitaxial growth process. In some embodiments, the wider n-type S/D region can have a lateral extension on each side greater (e.g., about 1 nm to about 10 nm greater) than that of the p-type S/D region. To form the n- and p-type S/D regions with such relative dimensions and with the S/D region top surfaces at substantially similar heights from the substrate, the S/D spacers along the n-type S/D region are formed with a height shorter (e.g., about 5 nm to about 10 nm shorter) than that of the S/D spacers along the p-type S/D region.

Though the present disclosure describes the S/D regions with reference to a finFET, the discussion of the S/D regions herein can be applied to the S/D regions of other FETs, such as GAA FETs and MOSFETs.

FIG. 1A illustrates an isometric view of a semiconductor device 100 with PFET 102P and NFET 102N, according to some embodiments. FIGS. 1B, 1D, 1H, and 1J illustrate different cross-sectional views of PFET 102P along line A-A of FIG. 1A. FIGS. 1C, 1E, 1I, and 1K illustrate different cross-sectional views of NFET 102N along line B-B of FIG. 1A. FIG. 1F illustrates a cross-sectional view of PFET 102P along line C-C of FIG. 1A. FIG. 1G illustrates a cross-sectional view of NFET 102N along line D-D of FIG. 1A. FIGS. 1B-1K illustrate cross-sectional views of semiconductor device 100 with additional structures that are not shown in FIG. 1A for simplicity. FIGS. 1D and 1E illustrate cross-sectional views of PFET 102P and NFET 102N with additional structures that are not shown in FIGS. 1B and 1C for simplicity. The discussion of elements with the same annotations applies to each other, unless mentioned otherwise.

Figures 1B, 1C:
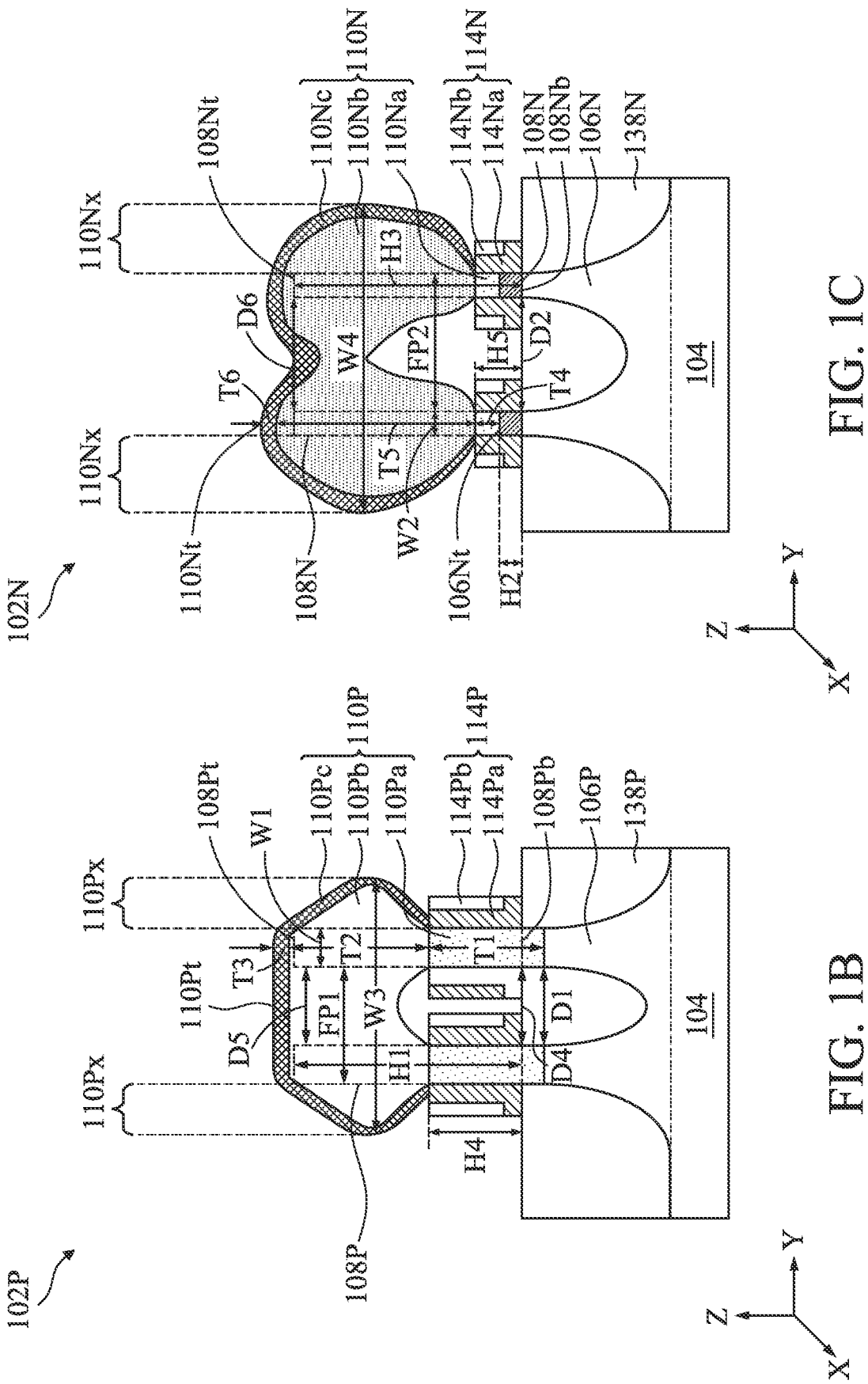
FIG. 1B-1K illustrate different cross-sectional views of a semiconductor device, in accordance with some embodiments.
Figures 1D, 1E:
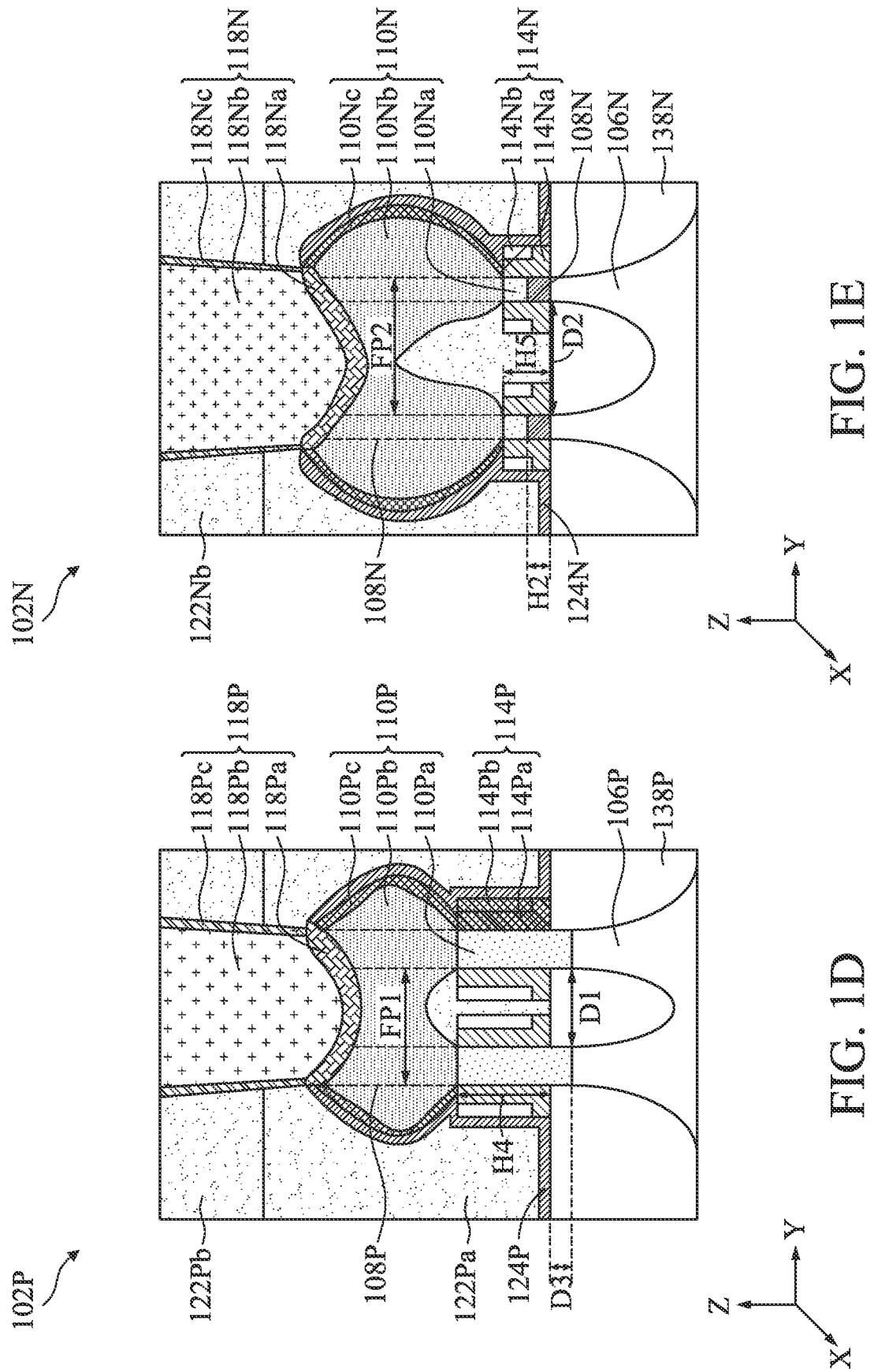
Figures 1F, 1G:
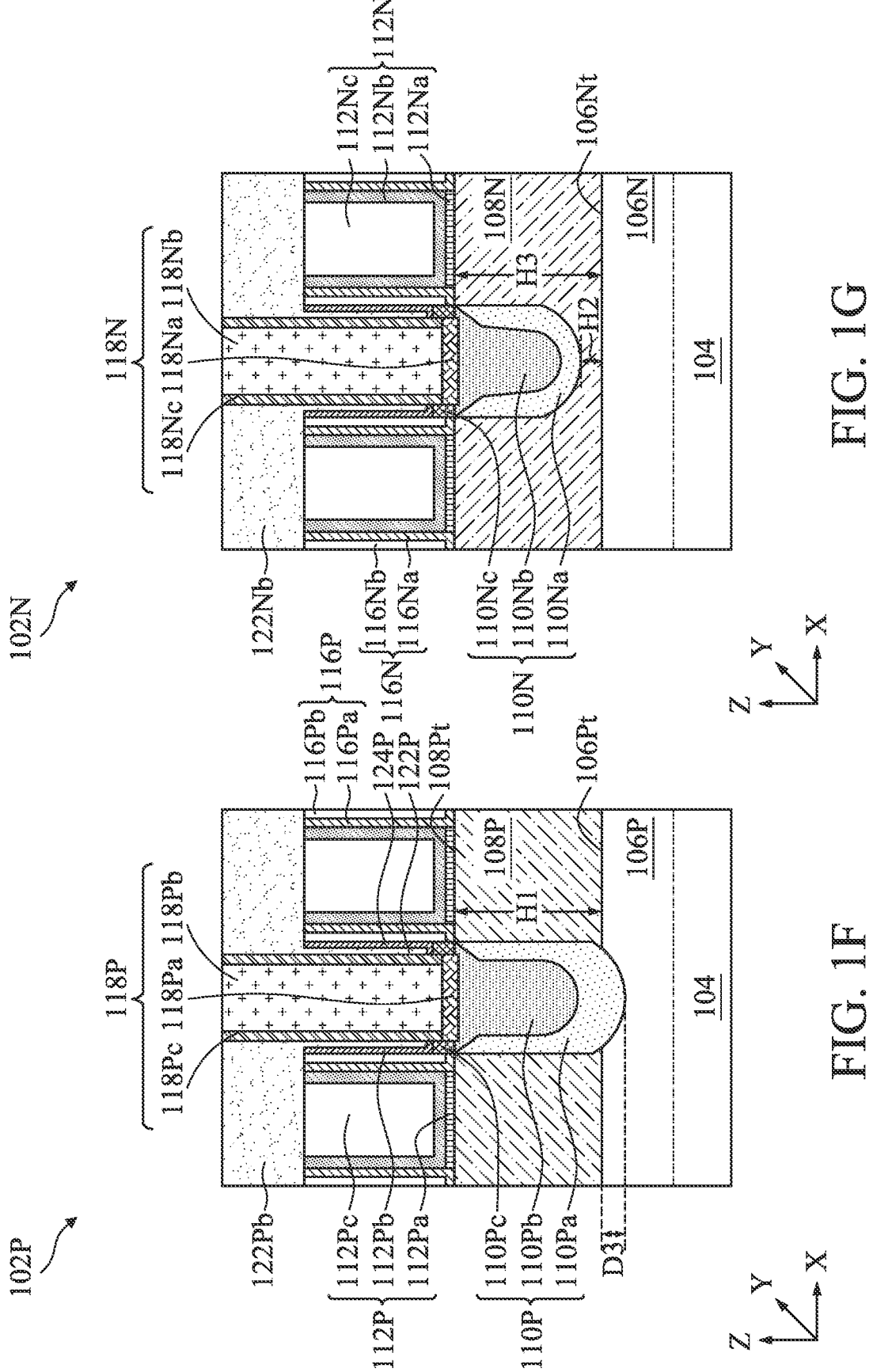

Referring to FIGS. 1A, 1B, 1D, and 1F, PFET 102P can include (i) fin bases 106P, (ii) fin structures 108P, (iii) S/D regions 110P, (iv) gate structures 112P, (v) S/D spacers 114P, (vi) gate spacers 116P, (vii) contact structures 118P, (viii) shallow trench isolation (STI) regions 120P, (ix) interlayer dielectric (ILD) layers 122Pa and 122Pb, and (x) etch stop layers (ESLs) 124P. Similarly, referring to FIGS. 1A, 1C, 1E, and 1G, NFET 102N can include (i) fin bases 106N, (ii) fin structures 108N, (iii) S/D regions 110N, (iv) gate structures 112N, (v) S/D spacers 114N, (vi) gate spacers 116N, (vii) contact structures 118N, (viii) shallow trench isolation (STI) regions 120N, (ix) interlayer dielectric (ILD) layers 122Na and 122Nb, and (x) etch stop layers (ESLs) 124N. FIGS. 1B and 1C illustrate cross-sectional views of PFET 102P and NFET 102N without ILD layers 122P and 122N, ESLs 124P and 124N, and contact structures 118P and 118N, which are shown in the cross-sectional views of PFET 102P and NFET 102N in FIGS. 1D and 1E. Though one of S/D regions 110P and 110N are discussed below, the discussion applies to other S/D regions of PFET 102P and NFET 102N.

Semiconductor device 100 can be formed on a substrate 104 with PFET 102P and NFET 102N formed on different regions of substrate 104. In some embodiments, other FETs and/or structures (e.g., isolation structures) can be formed between PFET 102P and NFET 102N on substrate 104. In some embodiments, PFET 102P and NFET 102N can be formed adjacent to each other and can have common elements, such as gate structures, gate spacers, ILD layers, ESLs, and STI regions.

Substrate 104 can be a semiconductor material, such as silicon, germanium (Ge), silicon germanium (SiGe), a silicon-on-insulator (SOI) structure, and a combination thereof. In some embodiments, fin bases 106P and 106N can be formed by patterning and etching different portions of substrate 104. Thus, fin bases 106P and 106N can include materials similar to that of substrate 104. In some embodiments, fin bases 106P can include n-type dopants (e.g., phosphorus or arsenic) and fin bases 106N can include p-type dopants (e.g., boron, indium, aluminum, or gallium). In some embodiments, adjacent fin bases 106N can be spaced apart from each by a distance D2 (e.g., about 20 nm to about 25 nm), which is greater than a distance D1 (e.g., about 10 nm to about 15 nm) between adjacent fin bases 106P. Fin bases 106P and 106N can be formed with such distances D1 and D2 between them to form S/D region 110N with a larger volume than S/D region 110P to achieve substantially similar device characteristics (e.g., similar threshold voltages) from PFET 102 and NFET 102N. In some embodiments, portions of fin bases 106P under S/D region 110P can be recessed by a distance D3 from top surfaces 106t of portions of fin bases 106P under gate structures 112P, as shown in FIG. 1F. These portions of fin bases 106P can be recessed during the formation of S/D region 110P, which is described in detail below.

Fin structures 108P and 108N can be formed on fin bases 106P and 106N, respectively, and can extend along an X-axis. In some embodiments, fin structures 108P can be disposed on the portions of fin bases 106P under gate structures 112P and not disposed on the portions of fin bases 106P under S/D region 110P, as shown in FIGS. 1B, 1D, and 1F. The dashed rectangular boxes in FIGS. 1B and 1D represent fin structures 108P disposed under gate structures 112P, which are not visible in the cross-sectional views of FIGS. 1B and 1D. Unlike fin structures 108P, first portions of fin structures 108N can be disposed on the portions of fin bases 106N under S/D region 110N, as shown in FIGS. 1C, 1E, and 1G. And, second portions of fin structures 108N can be disposed on the portions of fin bases 106N under gate structures 112N, as shown in FIGS. 1C, 1E, and 1G. The dashed rectangular boxes in FIGS. 1C and 1E represent the second portions of fin structures 108N disposed under gate structures 112N, which are not visible in the cross-sectional views of FIGS. 1C and 1E.

Referring to FIGS. 1A, 1B, 1D, and 1F, in some embodiments, fin structures 108P can be adjacent to and in contact with each S/D region 110P and can include an epitaxially-grown semiconductor material, such as undoped SiGe having a Ge atom concentration of about 10 atomic % to about 20 atomic %. Fin structures 108P form the channel regions under gate structures 112P. In some embodiments, fin structures 108P can have a fin height H1 of about 30 nm to about 80 nm along a Z-axis and a fin width W1 of about 8 nm to about 12 nm along a Y-axis. Within these ranges of fin height H1 and fin width W1, adequate device current can be generated and conducted through fin structures 108P without compromising the size and manufacturing cost of semiconductor device 100. In some embodiments, fin structures 108P can have a fin pitch FP1 of about 20 nm to about 25 nm along a Y-axis. The fin pitch is defined as a sum of a distance along a Y-axis between adjacent fin structures and a fin width along a Y-axis of one of the adjacent fin structures. The fin pitch of fin structures 108P can depend on distance D1 between fin bases 106P on which fin structures 108P are formed. In some embodiments, the spacing between fin structures 108P can vary along a Z-axis and can bend away from each other due to compressive stress in S/D region 110P. In some embodiments, fin bottoms 108Pb of fin structures 108P can be spaced apart from each other by a distance D4 of about 10 nm to about 15 nm and fin tops 108Pt of fin structures 108P can be spaced apart from each other by a distance D5 of about 15 nm to about 20 nm. In some embodiments, due to the outward bending of fin structures 108P, a difference (D5-D4) between distances D4 and D5 can be about 0.5 nm to about 2 nm.

Referring to FIGS. 1A, 1C, 1E, and 1G, in some embodiments, fin structures 108N can be adjacent to and in contact with each S/D region 110N and can include an epitaxially-grown semiconductor material, such as undoped Si without any concentration of Ge atoms. The first portions of fin structures 108N under S/D region 110N can form a shielding layer between S/D region 110N and fin bases 106N. The shielding layer can prevent the diffusion of dopants from S/D region 110N to fin bases 106N, thus preventing short channel effects in NFET 102N. In some embodiments, the first portions of fin structures 108N can have a fin height H2 of about 2 nm to about 5 nm. If fin height H2 is below about 2 nm, the first portions of fin structures 108N may not adequately prevent the diffusion of dopants from S/D region 110N to fin bases 106N. On the other hand, if fin height H2 is above about 5 nm, S/D region 110N may not be formed with the adequate volume to achieve device characteristics (e.g., threshold voltages) substantially similar to that of PFET 102P.

The second portions of fin structures 108N under gate structures 112N form the channel regions. In some embodiments, the second portions of fin structures 108N can have a fin height H3 of about 30 nm to about 80 nm along a Z-axis and a fin width W2 of about 4 nm to about 8 nm along a Y-axis. Within these ranges of fin height H3 and fin width W2, adequate device current can be generated and conducted through fin structures 108N without compromising the size and manufacturing cost of semiconductor device 100. In some embodiments, fin structures 108N can have a fin pitch FP2 of about 25 nm to about 30 nm along a Y-axis. The fin pitch of fin structures 108N can depend on distance D2 between fin bases 106N on which fin structures 108N are formed. In some embodiments, the spacing between fin structures 108N can vary along a Z-axis and can bend towards each other due to tensile stress in S/D region 110N. In some embodiments, fin bottoms 108Nb of fin structures 108N can be spaced apart from each other by a distance D2 of about 20 nm to about 25 nm and fin tops 108Nt of fin structures 108N can be spaced apart from each other by a distance D6 of about 15 nm to about 20 nm. In some embodiments, due to the inward bending of fin structures 108N, a difference (D6-D2) between distances D2 and D6 can be about 1 nm to about 3 nm.

In some embodiments, fin pitch FP2 can be greater than fin pitch FP1 by about 1 nm to about 5 nm and a ratio (FP2:FP1) between FP2 and FP1 can be about 1.1 to about 1.5. Fin structures 108P and 108N can be formed with such relative fin pitches to form S/D region 110N with a larger volume than S/D region 110P to achieve substantially similar device characteristics (e.g., similar threshold voltages) from PFET 102 and NFET 102N. In some embodiments, fin width W1 can be greater than fin width W2 by about 1 nm to about 5 nm and a ratio (W1:W2) between W1 and W2 can be about 1.1 to about 2. Fin structures 108P and 108N can be formed with such relative fin widths to achieve similar carrier mobility, thus achieving similar electrical characteristics in fin structures 108P and 108N. Otherwise, if fin widths of fin structures 108P and 108N are similar to each other, the carrier mobility (e.g., hole mobility) in fin structures 108P can be different (e.g., lower) than the carrier mobility (e.g., electron mobility) in fin structures 108N due to the different materials (e.g., SiGe and Si) of fin structures 108P and 108N. In some embodiments, fin structures 108P and 108N can be formed with fin heights H1 and H2 substantially equal to each other so that contact structures 118P and 118N can be formed at substantially similar depths into S/D regions 110P and 110N, respectively, to be in contact with or adjacent to fin structures 108P and 108N, as shown in FIGS. 1D and 1E.

Referring to FIGS. 1A, 1B, 1D, and 1F, in some embodiments, S/D region 110P can be in contact with fin bases 106P and fin structures 108P. As S/D region 110P is formed by the merging of two epitaxial structures grown on two fin bases 106P, S/D region 110P can be referred to as "merged S/D region 110P." In some embodiments, S/D region 110P can have a substantially flat top surface 110Pt and can include three S/D sub-regions 110Pa, 110Pb, and 110Pc. In some embodiments, S/D sub-regions 110Pa, 110Pb, and 110Pc can include epitaxially-grown SiGe and can differ from each other based on a relative concentration of Ge atoms with respect to Si atoms. For example, the Ge atom concentration in S/D sub-region 110Pa can be less than that in S/D sub-regions 110Pb and 110Pc. In some embodiments, S/D sub-region 110Pa can include a Ge atom concentration of about 25 atomic % to about 35 atomic % with any remaining atomic % being Si atoms. In some embodiments, S/D sub-region 110Pb can include a Ge atom concentration of about 35 atomic % to about 60 atomic % with any remaining atomic % being Si atoms. In some embodiments, S/D sub-region 110Pc can include a Ge atom concentration of about 45 atomic % to about 55 atomic % with any remaining atomic % being Si atoms.

In some embodiments, S/D sub-regions 110Pa, 110Pb, and 110Pc can differ from each other based on p-type dopant (e.g., boron atoms) concentrations. For example, S/D sub-region 110Pa can have a p-type dopant concentration lower than that in S/D sub-regions 110Pb and 110Pc. S/D sub-region 110Pb can have a p-type dopant concentration higher than that in S/D sub-region 110Pc. A higher dopant concentration in S/D sub-region 110Pb can reduce contact resistance between S/D region 110P and contact structure 118P (shown in FIG. 1D). In some embodiments, S/D sub-region 110Pa can include a boron dopant concentration of about $1 \times 10^{20}$ to about $8 \times 10^{20}$ atoms/cm³. In some embodiments, S/D sub-region 110Pb can include a boron dopant concentration of about $8 \times 10^{20}$ to about $3 \times 10^{21}$ atoms/cm³. In some embodiments, S/D sub-region 110Pc can include a boron dopant concentration of about $1 \times 10^{21}$ to about $2 \times 10^{21}$ atoms/cm³.

S/D sub-region 110Pa can act as a shielding layer to prevent the diffusion of p-type dopants (e.g., boron atoms) from S/D region 110P to fin bases 106P, thus preventing short channel effects in PFET 102P. S/D sub-region 110Pc can act as a capping layer to protect S/D sub-region 110Pb and prevent out-diffusion of the p-type dopants from S/D sub-region 110Pb during any subsequent processing of PFET 102P. In some embodiments, top surface 110Pt of S/D sub-region 110Pc can be at a higher plane than fin top 108Pt and top surface of S/D sub-region 110Pb can be closer to fin top 108Pt so that contact structure 118P formed through S/D sub-region 110Pc and on S/D sub-region 110Pb can be in contact with or adjacent to fin structures 108P, as shown in FIG. 1D.

In some embodiments, S/D sub-region 110Pa can have a thickness T1 of about 20 nm to about 30 nm, S/D sub-region 110Pb can have a thickness T2 of about 30 nm to about 40 nm, and S/D sub-region 110Pc can have a thickness T3 of about 5 nm to about 10 nm. Within these ranges of thicknesses T1, T2, and T3, S/D sub-regions 110Pa, 110Pb, and 110Pc can adequately perform their functions without compromising the size and manufacturing cost of PFET 102P. In some embodiments, the widest portion of S/D region 110P can have a width W3 of about 55 nm to about 70 nm along a Y-axis. Within these ranges of width W3 and thicknesses T1, T2, and T3, S/D region 110P can be formed with adequate volume to achieve device characteristics (e.g., threshold voltages) substantially similar to that of NFET 102N. In some embodiments, S/D region 110P can have S/D portions 110Px that laterally extend from sidewalls of S/D sub-regions 110Pa and over STI regions 138P and S/D spacers 114P. The width of each of S/D portions 110Px can vary along a Z-axis within a range of about 10 nm to about 15 nm. Within this width range for each S/D portion 110Px, S/D region 110P can be formed with the volume to adequately perform its functions without merging with other S/D regions epitaxially grown on fin bases adjacent to fin bases 106P.

Referring to FIGS. 1A, 1C, 1E, and 1G, in some embodiments, S/D region 110N can be in contact with fin structures 108N and not in contact with fin bases 106N. As S/D region 110N are formed by the merging of two epitaxial structures grown on two fin structures 108N, S/D region 110N can be referred to as "merged S/D region 110N." In some embodiments, S/D region 110N can have a non-planar (e.g., wavy) top surface 110Nt and can include three S/D sub-regions

110Na, 110Nb, and 110Nc. In some embodiments, S/D sub-regions 110Na, 110Nb, and 110Nc can include epitaxially-grown Si without any Ge atoms and can differ from each other based on n-type dopant (e.g., phosphorus atoms) concentrations. For example, S/D sub-region 110Na can have an n-type dopant concentration lower than that in S/D sub-regions 110Nb and 110Nc. S/D sub-region 110Nb can have an n-type dopant concentration higher than that in S/D sub-region 110Nc. A higher dopant concentration in S/D sub-region 110Nb can reduce contact resistance between S/D region 110N and contact structure 118N (shown in FIG. 1E). In some embodiments, S/D sub-region 110Na can include a phosphorus dopant concentration of about $1 \times 10^{20}$ to about $5 \times 10^{20}$ atoms/cm³. In some embodiments, S/D sub-region 110Nb can include a phosphorus dopant concentration of about $5 \times 10^{20}$ to about $4 \times 10^{21}$ atoms/cm³. In some embodiments, S/D sub-region 110Nc can include a phosphorus dopant concentration of about $1 \times 10^{21}$ to about $3 \times 10^{21}$ atoms/cm³.

Similar to S/D sub-region 110Pc, S/D sub-region 110Nc can act as a capping layer to protect S/D sub-region 110Nb and prevent out-diffusion of the n-type dopants from S/D sub-region 110Nb during any subsequent processing of NFET 102N. In some embodiments, top surface 110Nt of S/D sub-region 110Nc can be at a higher plane than fin top 108Nt and top surface of S/D sub-region 110Nb can be closer to fin top 108Nt so that contact structure 118N formed through S/D sub-region 110Nc and on S/D sub-region 110Nb can be in contact or adjacent to with fin structures 108N, as shown in FIG. 1E. The peak regions of S/D region 110N can referred to as top surfaces 110Nt of S/D region 110N.

In some embodiments, S/D sub-region 110Na can have a thickness T4 of about 5 nm to about 10 nm, S/D sub-region 110Nb can have a thickness T5 of about 40 nm to about 60 nm, and S/D sub-region 110Nc can have a thickness T6 of about 1 nm to about 5 nm. Within these ranges of thicknesses T4, T5, and T6, S/D sub-regions 110Na, 110Nb, and 110Nc can adequately perform their functions without compromising the size and manufacturing cost of NFET 102N. Also, thickness T4 of S/D sub-region 110Na can control thickness T5 of S/D sub-region 110Nb. Within this range of thickness T4, S/D sub-region 110Nb can be formed with its top surface at substantially the same height from substrate 104 as the top surface of S/D sub-region 110Pb. The peak regions of S/D sub-region 110Nb can referred to as the top surfaces of S/D sub-region 110Nb. By forming these top surfaces at substantially the same height, contact structures 118P and 118N can be formed at substantially similar depths into S/D regions 110P and 110N, respectively, to be in contact or adjacent to with fin structures 108P and 108N, as shown in FIGS. 1D and 1E. By forming contact structures 118P and 118N at substantially similar depths, contact structures 118P and 118N can be formed at the same processing step, thus reducing the number of processing steps and device manufacturing cost.

In some embodiments, the widest portion of S/D region 110N can have a width W4 of about 60 nm to about 75 nm along a Y-axis. Within these ranges of width W4 and thicknesses T4, T5, and T6, S/D region 110N can be formed with adequate volume to achieve device characteristics (e.g., threshold voltages) substantially similar to that of PFET 102P. In some embodiments, S/D region 110N can have S/D portions 110Nx that laterally extend from sidewalls of S/D sub-regions 110Na and over STI regions 138N and S/D spacers 114N. The width of each of S/D portions 110Nx can vary along a Z-axis within a range of about 15 nm to about 20 nm. Within this width range for each S/D portion 110Nx, S/D region 110N can be formed with the volume to adequately perform its functions without merging with other S/D regions epitaxially grown on fin bases adjacent to fin bases 106N.

In some embodiments, to achieve substantially similar device characteristics (e.g., threshold voltages) between PFET 102P and NFET 102N and/or to form top surfaces 110Pt and 110Nt at substantially the same height from substrate 104, S/D regions 110P and 110N can be formed with relative dimensions, such as: (i) width W4 of S/D region 110N can be greater than width W3 of S/D region 110P by about 5 nm to about 20 nm, (ii) a ratio (W4:W3) between width W4 and W3 can be about 1.1 to about 2, (iii) the width of S/D portions 110Nx can be greater than the width of S/D portions 110Px by about 1 nm to about 10 nm, (iv) thickness T1 of S/D sub-region 110Pa can be greater than thickness T4 of S/D sub-region 110Na by about 10 nm to about 20 nm, (v) thickness T5 of S/D sub-region 110Nb can be greater than thickness T2 of S/D sub-region 110Pb by about 20 nm to about 300 nm, and (vi) thickness T3 of S/D sub-region 110Pc can be greater than thickness T6 of S/D sub-region 110Nc by about 1 nm to about 5 nm.

In some embodiments, the above mentioned relative dimensions of S/D regions 110P and 110N can be controlled by the relative dimensions of S/D spacers 114P and 114N. For example, to achieve the above mentioned relative dimensions of S/D regions 110P and 110N, S/D spacers 114P can be formed along opposite sidewalls of S/D sub-region 110Pa with a height H4 greater than a height H5 of S/D spacers 114N along opposite sidewalls of S/D sub-region 110Na. In some embodiments, height H4 can be about 10 nm to about 20 nm and height H5 can be about 5 nm to about 10 nm. In some embodiments, S/D spacers 114P and 114N can be formed with a height difference (H4-H5) of about 5 nm to about 10 nm between them.

In some embodiments, the epitaxial lateral growth of S/D regions 110P and 110N along a Y-axis can be controlled by S/D spacers 114P and 114N. As a result, S/D spacers 114P and 114N can prevent S/D regions 110P and 110N from merging with adjacent S/D regions during their epitaxial growth. In some embodiments, S/D spacers 114P can limit the epitaxial lateral growth of each S/D portion 110Px to a lateral distance of about 10 nm to about 15 nm. Similarly, in some embodiments, S/D spacers 114N can limit the epitaxial lateral growth of each S/D portion 110Nx to a lateral distance of about 15 nm to about 20 nm.

In some embodiments, each S/D spacer 114P can include a first dielectric layer 114Pa disposed on S/D sub-region 110Pa and on STI region 138P and a second dielectric 114Pb disposed on first dielectric layer 114Pa. Similarly, in some embodiments, each S/D spacer 114N can include a first dielectric layer 114Na disposed on S/D sub-region 110Na and on STI region 138N and a second dielectric 114Nb disposed on first dielectric layer 114Na. In some embodiments, first dielectric layers 114Pa and 114Na and second dielectric layers 114Pb and 114Nb can include dielectric materials, such as silicon nitride (SiN), silicon carbon nitride (SiCN), silicon carbon oxynitride (SiCON), and other suitable dielectric materials.

Referring to FIGS. 1D and 1E, in some embodiments, contact structures 118P and 118N can be disposed directly on S/D sub-regions 110Pb and 110Nb, respectively, to electrically connect S/D regions 110P and 110N to other elements of semiconductor device 100 and/or to other active and/or passive devices (not shown) in an integrated circuit. In some embodiments, contact structure 118P can include (i)

a silicide layer 118Pa disposed directly on S/D sub-region 110Pb, (ii) a contact plug 118Pb disposed directly on silicide layer 118Pa, and (iii) a diffusion barrier layer 118Pc disposed directly on sidewalls of contact plug 118Pb and surrounding contact plug 118Pb. Similarly, in some embodiments, contact structure 118N can include (i) a silicide layer 118Na disposed directly on S/D sub-region 110Nb, (ii) a contact plug 118Nb disposed directly on silicide layer 118Na, and (iii) a diffusion barrier layer 118Pc disposed directly on sidewalls of contact plug 118Nb and surrounding contact plug 118Nb.

In some embodiments, silicide layers 118Pa and 118Na can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination. In some embodiments, contact plugs 118Pb and 118Nb can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof.

Diffusion barrier layers 118Pc and 118Nc can prevent the oxidation of contact plugs 118Pb and 118Nb by preventing the diffusion of oxygen atoms from adjacent structures (e.g., ILD layers 122Pb and 122Nb) to contact plugs 118Pb and 118Nb. In some embodiments, diffusion barrier layers 118Pc and 118Nc can include a dielectric material, such as silicon oxide ($SiO_2$), SiN, silicon oxynitride (SiON), SiCN, SiOCN, aluminum oxide ($Al_2O_3$), aluminum oxynitride (AlON), zirconium oxide ($ZrO_2$), hafnium oxide ($HfO_2$), titanium oxide ($TiO_2$), zirconium aluminum oxide (ZrAlO), zinc oxide ($ZnO_2$), and other suitable dielectric materials.

ILD layers 122Pa and 122Pb and ESLs 124P can provide electrical isolation between contact structure 118P and gate structures 112P. Similarly, ILD layers 122Na and 122Nb and ESLs 12NP can provide electrical isolation between contact structure 118N and gate structures 112N. In some embodiments, ILD layers 122Pa, 122Pb, 122Na, 122Nb, and ESLs 124P and 124N can include a dielectric material, such as $SiO_2$, SiN, SiON, SiCO, SiCN, SiCON, and other suitable dielectric materials. In some embodiments, ILD layers 122Pa, 122Pb, 122Na, 122Nb can include an oxide material and ESLs 124P and 124N can include a nitride material different from ILD layers 122Pa, 122Pb, 122Na, 122Nb. In some embodiments, STI regions 138P and 138N can provide electrical isolation to fin bases 106P and 106N from adjacent structures integrated with or deposited onto substrate 102. STI regions 106P and 106N can have a dielectric material, such as $SiO_2$, SiN, SiON, fluorine-doped silicate glass (FSG), and other suitable insulating materials.

Referring to FIGS. 1F and 1G, gate structures 112P and 112N can be disposed on fin structures 108P and 108N, respectively. In some embodiments, each of gate structures 112P can include (i) an interfacial oxide (IL) layer 112Pa disposed directly on fin structure 108P, (ii) a high-k gate dielectric layer 112Pb disposed directly on IL layer 112Pa, and (iii) a conductive layer 112Pc disposed directly on high-k gate dielectric layer 112Pb. Similarly, in some embodiments, each of gate structures 112N can include (i) an interfacial oxide (IL) layer 112Na disposed directly on fin structure 108N, (ii) a high-k gate dielectric layer 112Nb disposed directly on IL layer 112Na, and (iii) a conductive layer 112Nc disposed directly on high-k gate dielectric layer 112Nb. In some embodiments, IL layers 112Pa and 112Na can include $SiO_2$, silicon germanium oxide ($SiGeO_x$), or germanium oxide ($GeO_x$). In some embodiments, high-k gate dielectric layers 112Pb and 112Nb can include a high-k dielectric material, such as hafnium oxide ($HfO^2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium aluminum oxide (ZrAlO), zirconium silicate ($ZrSiO_2$), lanthanum oxide ($La_2O_3$), aluminum oxide ($Al_2O_3$) zinc oxide (ZnO), hafnium zinc oxide (HfZnO), and yttrium oxide ($Y_2O_3$).

In some embodiments, conductive layers 112Pc and 112Nc can be multi-layered structures. The different layers of conductive layers 112Pc and 112Nc are not shown for simplicity. Each of conductive layers 112Pc and 112Nc can include a work function metal (WFM) layer disposed on high-k gate dielectric layers 112Pb and 112Nb, respectively, and a gate metal fill layer disposed on the WFM layer. In some embodiments, the WFM layer of conductive layer 112Pc can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu). In some embodiments, the WFM layer of conductive layer 112Nc can include titanium aluminum (TiAl), titanium aluminum carbide (TiAlC), tantalum aluminum (TaAl), tantalum aluminum carbide (TaAlC), Al-doped T1, Al-doped TiN, Al-doped Ta, Al-doped TaN, or other suitable Al-based materials. The gate metal fill layers of conductive layers 112Pc and 112Nc can include a suitable conductive material, such as tungsten (W), T1, silver (Ag), ruthenium (Ru), molybdenum (Mo), copper (Cu), cobalt (Co), Al, iridium (Ir), nickel (Ni), metal alloys, and a combination thereof.

In some embodiments, gate structures 112P can be electrically isolated from adjacent contact structure 118P by gate spacers 116P and gate structures 112N can be electrically isolated from adjacent contact structure 118N by gate spacers 116N. In some embodiments, each gate spacers 116P can include a first dielectric layer 116Pa disposed on high-k dielectric layer 112Pb and a second dielectric 116Pb disposed on first dielectric layer 116Pa. Similarly, in some embodiments, each gate spacers 116N can include a first dielectric layer 116Na disposed on high-k dielectric layer 112Nb and a second dielectric 116Nb disposed on first dielectric layer 116Na. In some embodiments, first dielectric layers 116Pa and 116Na and second dielectric layers 116Pb and 116Nb can include dielectric materials, such as SiN, SiCN, SiCON, and other suitable dielectric materials. In some embodiments, first dielectric layers 116Pa and 114Pa are portions of the same spacer material layer and can be in direct contact with each other. Similarly, first dielectric layers 116Na and 114Na are portions of the same spacer material layer and can be in direct contact with each other. In some embodiments, second dielectric layers 116Pb and 114Pb are portions of the same spacer material layer and can be in direct contact with each other. Similarly, second dielectric layers 116Nb and 114Nb are portions of the same spacer material layer and can be in direct contact with each other.

Figures 1H, 1I:
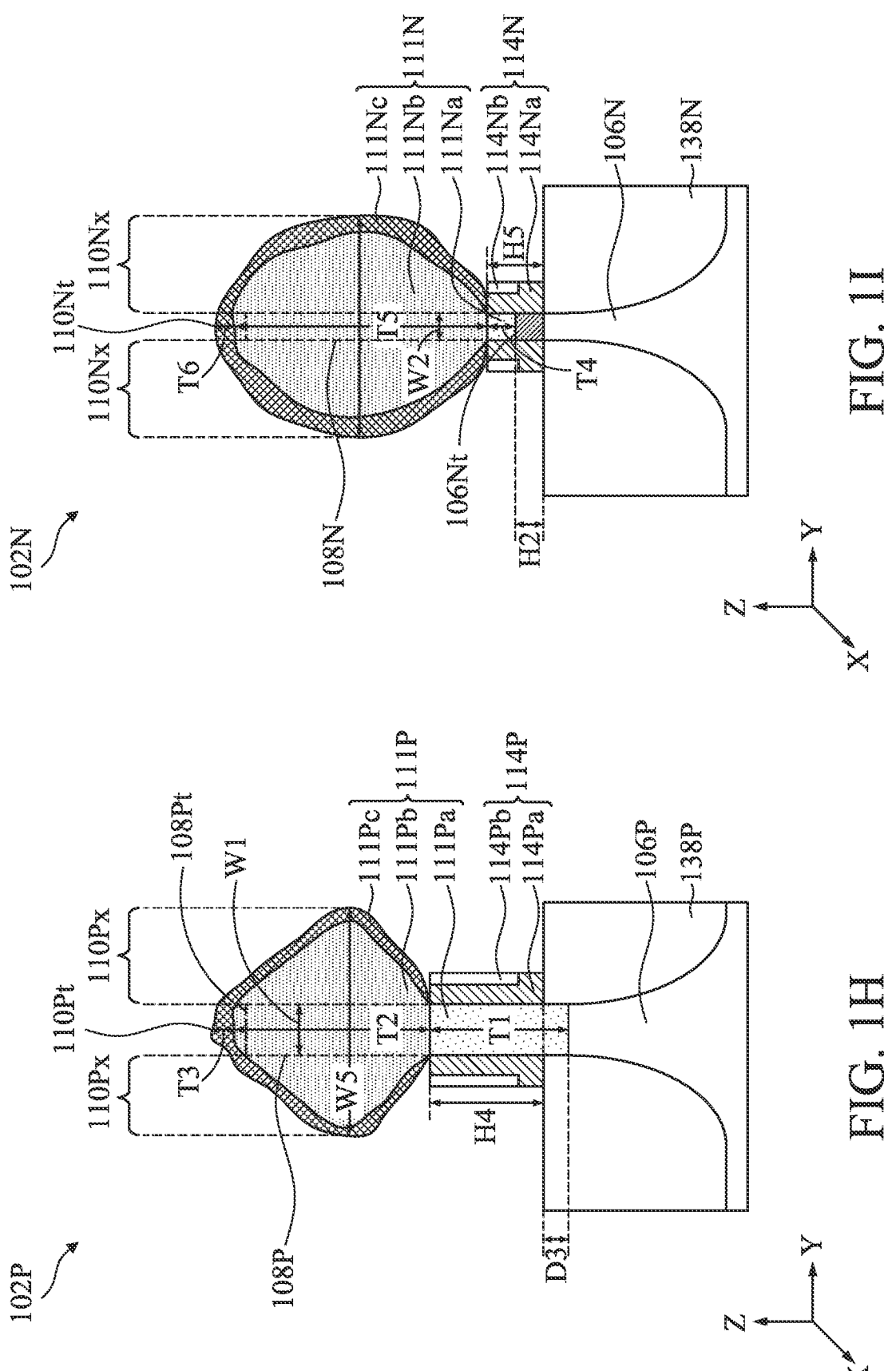
Figures 1J, 1K:
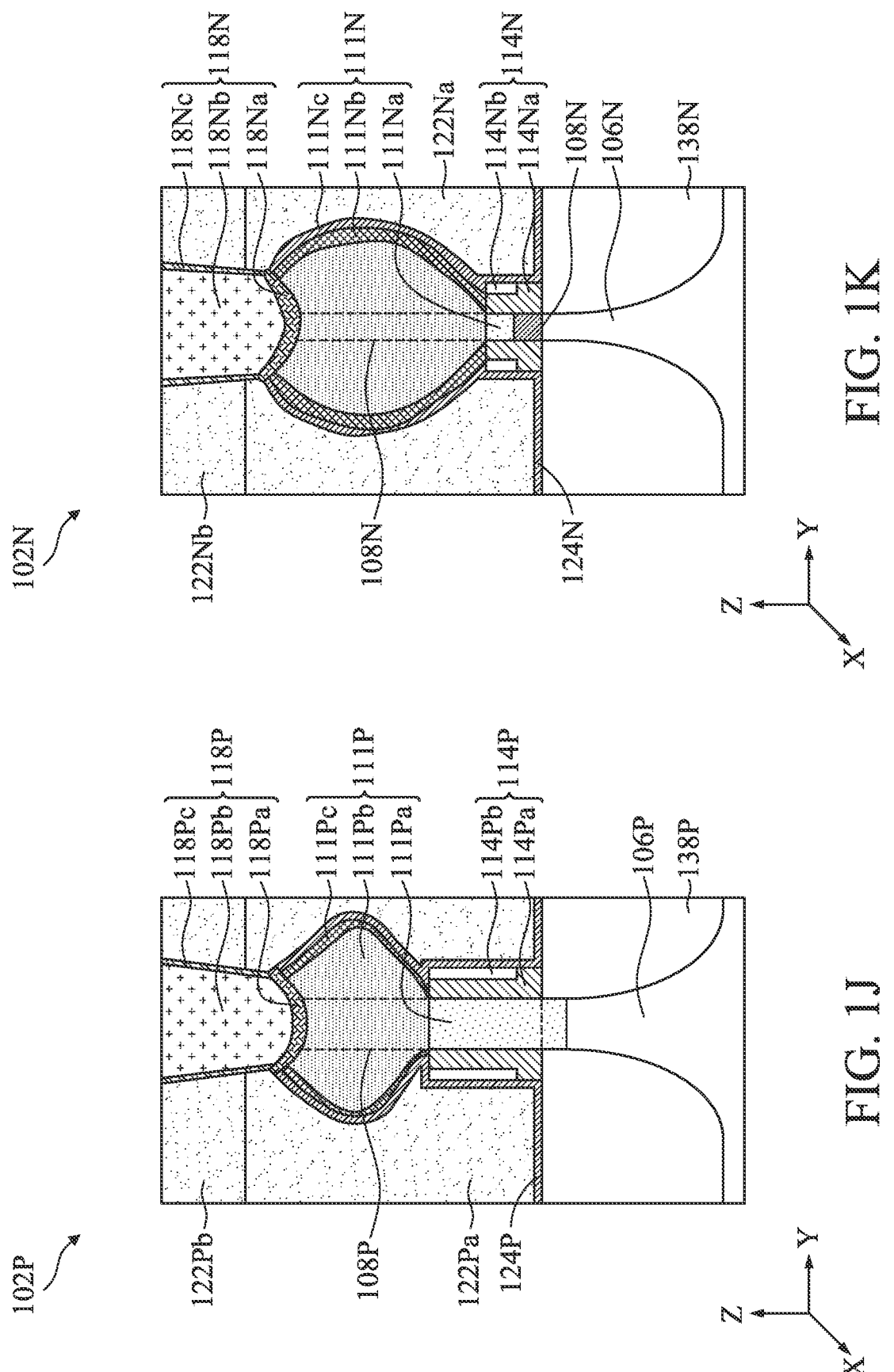

Referring to FIGS. 1H and 1J, in some embodiments, PFET 102P can have diamond-shaped S/D region 111P epitaxially grown on one fin base 106P and in contact with one fin structure 108P, instead of merged S/D region 110P. Similarly, referring to FIGS. 1I and 1K, NFET 102N can have oval-shaped S/D region 111N epitaxially grown on one fin base 106N and in contact with one fin structure 108N, instead of merged S/D region 110N. The discussion of merged S/D regions 110P and 110N applies to S/D regions 111P and 111N, respectively, unless mentioned otherwise. FIGS. 1H and 1I illustrate cross-sectional views of PFET 102P and NFET 102N without ILD layers 122P and 122N, ESLs 124P and 124N, and contact structures 118P and 118N, which are shown in the cross-sectional views of PFET 102P and NFET 102N in FIGS. 1J and 1K.

In some embodiments, S/D region 111P can have a width W5 of about 30 nm to about 40 nm and S/D region 111N can have a width W6 of about 40 nm to about 50 nm. In some embodiments, to achieve substantially similar device characteristics (e.g., threshold voltages) between PFET 102P and NFET 102N and/or to form top surfaces 111Pt and 111Nt at substantially the same height from substrate 104, S/D regions 111P and 111N can be formed with relative dimensions, such as: (i) width W6 of S/D region 111N can be greater than width W5 of S/D region 111P by about 1 nm to about 10 nm, (ii) a ratio (W6:W5) between width W6 and W5 can be about 1.1 to about 1.5, (iii) the width of S/D portions 111Nx can be greater than the width of S/D portions 111Px by about 1 nm to about 10 nm, (iv) thickness T1 of S/D sub-region 111Pa can be greater than thickness T4 of S/D sub-region 111Na by about 10 nm to about 20 nm, (v) thickness T5 of S/D sub-region 111Nb can be greater than thickness T2 of S/D sub-region 111Pb by about 20 nm to about 300 nm, and (vi) thickness T3 of S/D sub-region 111Pc can be greater than thickness T6 of S/D sub-region 111Nc by about 1 nm to about 5 nm. Similar to merged S/D regions 110P and 110N, the above mentioned relative dimensions of S/D regions 111P and 111N can be controlled by the relative dimensions of S/D spacers 114P and 114N.

FIG. 2 is a flow diagram of an example method 200 for fabricating PFET 102P and NFET 102N with cross-sectional views shown in FIGS. 1B-1G, according to some embodiments. For illustrative purposes, the operations illustrated in FIG. 2 will be described with reference to the example fabrication process for fabricating PFET 102P and NFET 102N as illustrated in FIGS. 3A-9A, 3B-9B, 3C-9C, and 3D-9D. FIGS. 3A-9A are cross-sectional views of PFET 102P along line A-A of FIG. 1A at various stages of its fabrication, according to some embodiments. FIGS. 3B-9B are cross-sectional views of NFET 102N along line B-B of FIG. 1A at various stages of its fabrication, according to some embodiments. FIGS. 3C-9C are cross-sectional views of PFET 102P along line C-C of FIG. 1A at various stages of its fabrication, according to some embodiments. FIGS. 3D-9D are cross-sectional views of NFET 102N along line D-D of FIG. 1A at various stages of its fabrication, according to some embodiments. Operations can be performed in a different order or not performed depending on specific applications. It should be noted that method 200 may not produce a complete PFET 102P and NFET 102N. Accordingly, it is understood that additional processes can be provided before, during, and after method 200, and that some other processes may only be briefly described herein. Elements in FIGS. 3A-9A, 3B-9B, 3C-9C, and 3D-9D with the same annotations as elements in FIGS. 1A-1G are described above.

In operation 205, fin structures of a PFET and an NFET are formed on fin bases on a substrate and polysilicon structures are formed on the fin structures. For example, as described with reference to FIGS. 3A-3D, fin structures 108P of PFET 102P are formed on fin bases 106P, fin structures 108N of NFET 102N are formed on fin bases 106N, and polysilicon structures 312P and 312N are formed on fin structures 108P and 108N, respectively. In some embodiments, fin structures 108P and 108N can be selectively and sequentially formed on different regions of substrate 104 in different processing steps. In some embodiments, the formation of fin structures 108P can be followed by the formation of fin structures 108N and vice versa.

Figures 3A, 3B:
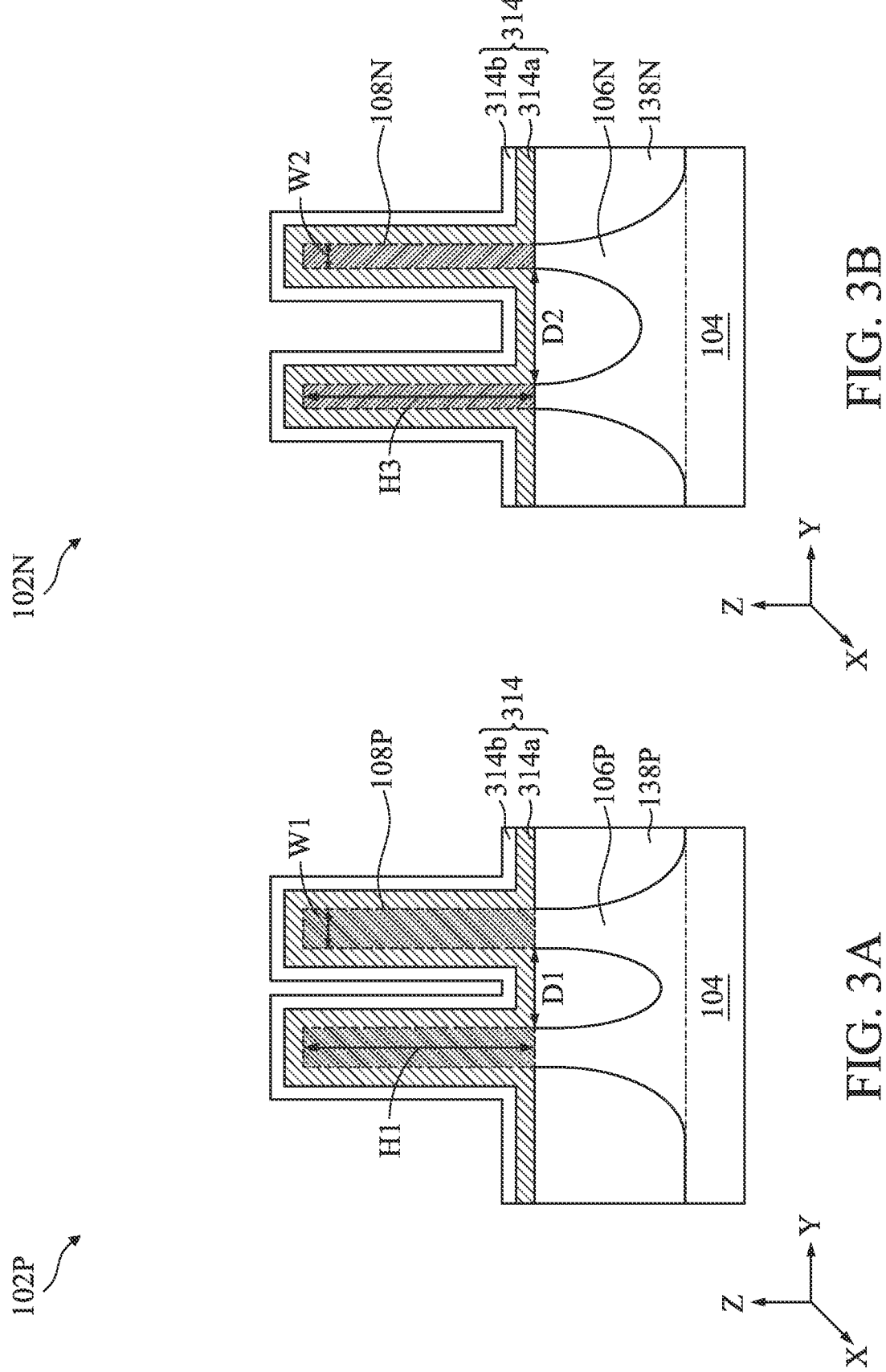
FIGS. 3A-9D illustrate cross-sectional views of a semiconductor device at various stages of its fabrication process, in accordance with some embodiments.
Figures 3C, 3D:
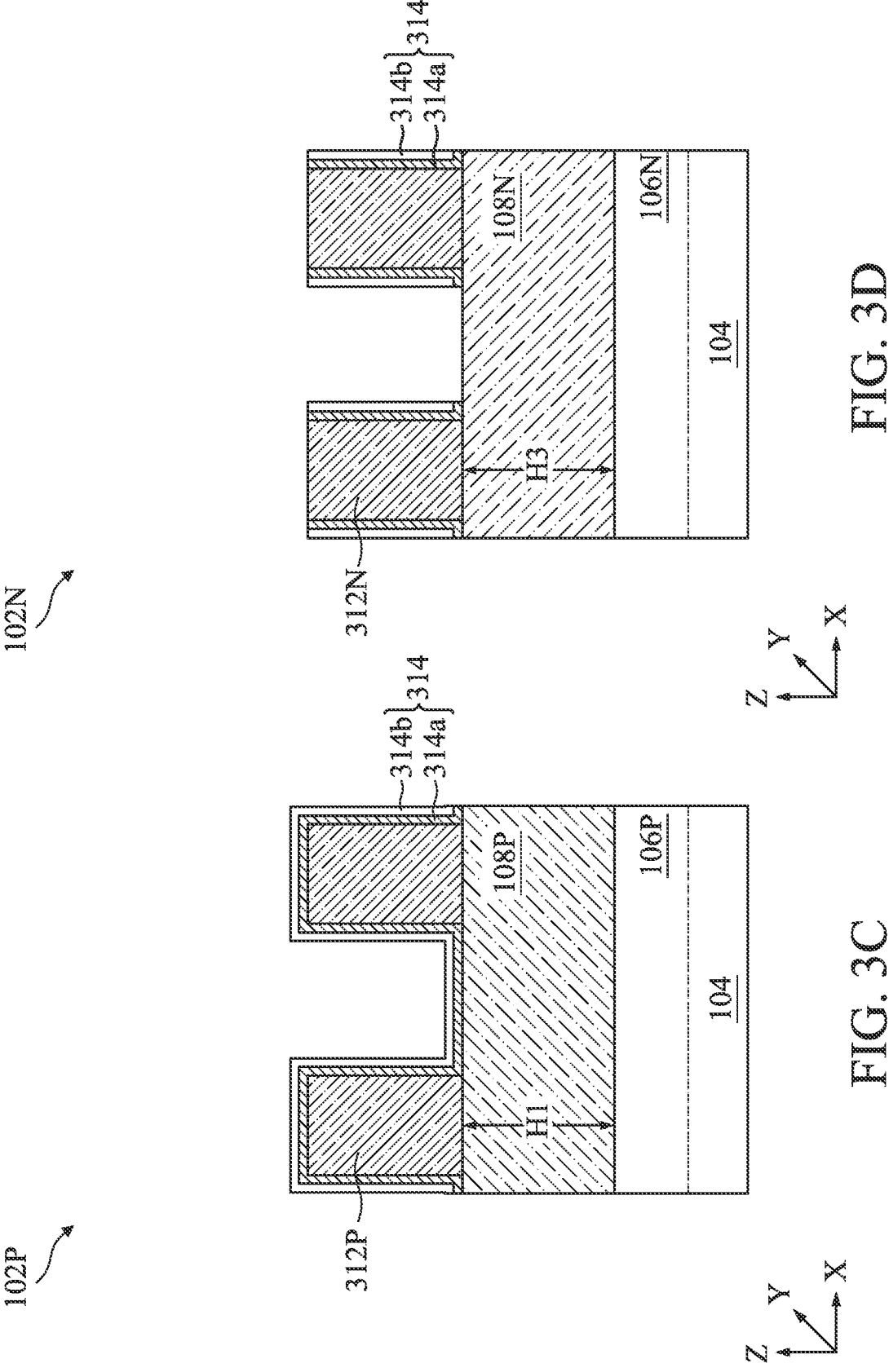

In some embodiments, the formation of fin structures 108P can include sequential operations of (i) forming a masking layer (not shown) on a portion of substrate 104 on which NFET 102N is to be formed, (ii) epitaxially growing a layer of semiconductor material (e.g., SiGe with a Ge atom concentration of about 10 atomic % to about 20 atomic %; not shown) of fin structures 108P on a portion of substrate 104 on which PFET 102P is to be formed, and (iii) performing a lithographic pattering and etching process on the layer of semiconductor material and substrate 104 to form fin structures 108P and fin bases 106P under fin structures 108P, as shown in FIGS. 3A and 3C. In some embodiments, the formation of fin structures 108N can include sequential operations of (i) forming a masking layer (not shown) on the structure of PFET 102N formed after the formation of fin structures 108P, (ii) epitaxially growing a layer of semiconductor material (e.g., Si without Ge atoms; not shown) of fin structures 108N on the portion of substrate 104 on which NFET 102N is to be formed, and (iii) performing a lithographic pattering and etching process on the layer of semiconductor material and substrate 104 to form fin structures 108N and fin bases 106N under fin structures 108N, as shown in FIGS. 3B and 3D. The formation of fin structures 108N can be followed by the formation of polysilicon structures 312P and 312N on fin structures 108P and 108N, respectively. During subsequent processing, polysilicon structures 312P and 312N can be replaced with gate structures 112P and 112N in a gate replacement process.

Referring to FIG. 2, in operation 210, S/D spacers, gate spacers, and S/D openings are formed on the fin bases of the PFET and on the fin structures of the NFET. For example, as described with reference to FIGS. 3A-6D, gate spacers 116P and 116N are formed on sidewalls of polysilicon structures 312P and 312N, respectively, S/D spacers 114P and 114N are formed on sidewalls of fin structures 108P and 108N, respectively, S/D openings 510P are formed on fin bases 106P, and S/D openings 610N are formed on fin structures 108N.

In some embodiments, gate spacers 116P and 116N and S/D spacers 114P and 114N can be formed from the same spacer material layer 314 at different stages of selectively etching spacer material layer 314. Spacer material layer 314 can include first and second dielectric layers 314a and 314b having SiO$_2$, SiN, SiON, SiCO, SiCN, SiCON, and other suitable insulating materials. The formation of gate spacers 116P and 116N and S/D spacers 114P and 114N can start with depositing a substantially conformal spacer material layer 314 directly on polysilicon structures 312P and 312N, fin structures 108P and 108N, and STI regions 138P and 138N, as shown in FIGS. 3A, 3B, 3C, and 3D. The deposition of spacer material layer 314 can be followed by a first etching process to etch portions of spacer material layer 314 from top surfaces of polysilicon structures 312P and 312N, fin structures 108P and 108N, and STI regions 138P and 138N to form the structures of FIGS. 4A, 4B, 4C, and 4D. Thus, after the first etching process, gate spacers 116P and 116N can be formed as shown in FIGS. 4C and 4D, and spacer portions 314* on sidewall surfaces of fin structures 108P and 108N can be formed as shown in FIGS. 4A and 4B.

In some embodiments, the first etching process can be an anisotropic dry etching process and can have a higher etching rate along a Z-axis than along an X-axis or a Y-axis. As a result, spacer material layer 314 on top surfaces of polysilicon structures 312P and 312N, fin structures 108P and 108N, and STI regions 138P and 138N can be removed, while spacer portions 314* on sidewall surfaces of fin structures 108P and 108N can remain. The etching gases used in the first etching process can have a higher selectivity for spacer material layer 314 than for polysilicon structures 312P and 312N, fin structures 108P and 108N, and STI regions 138P and 138N.

Figures 4A, 4B:
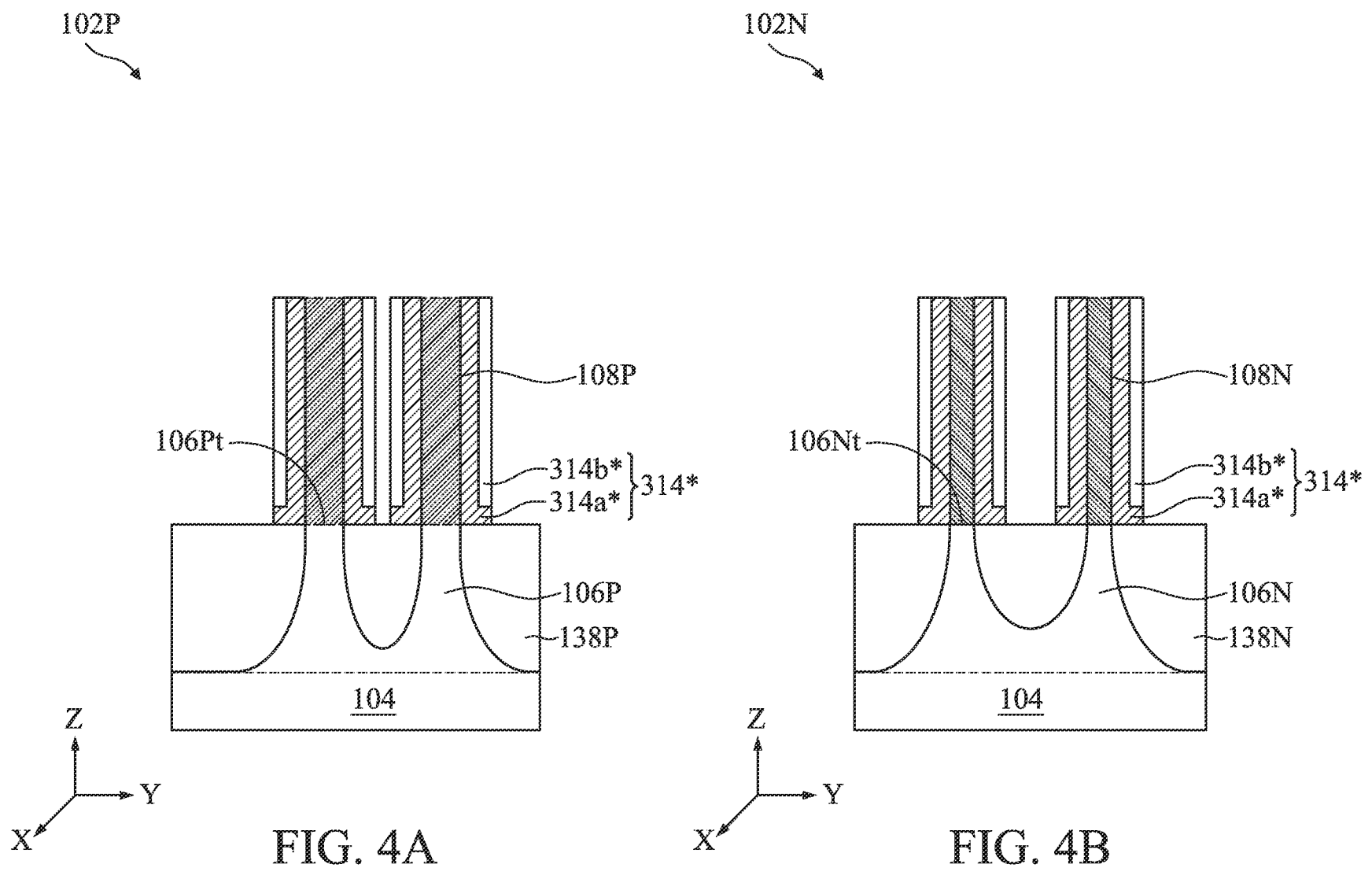
Figures 4C, 4D:
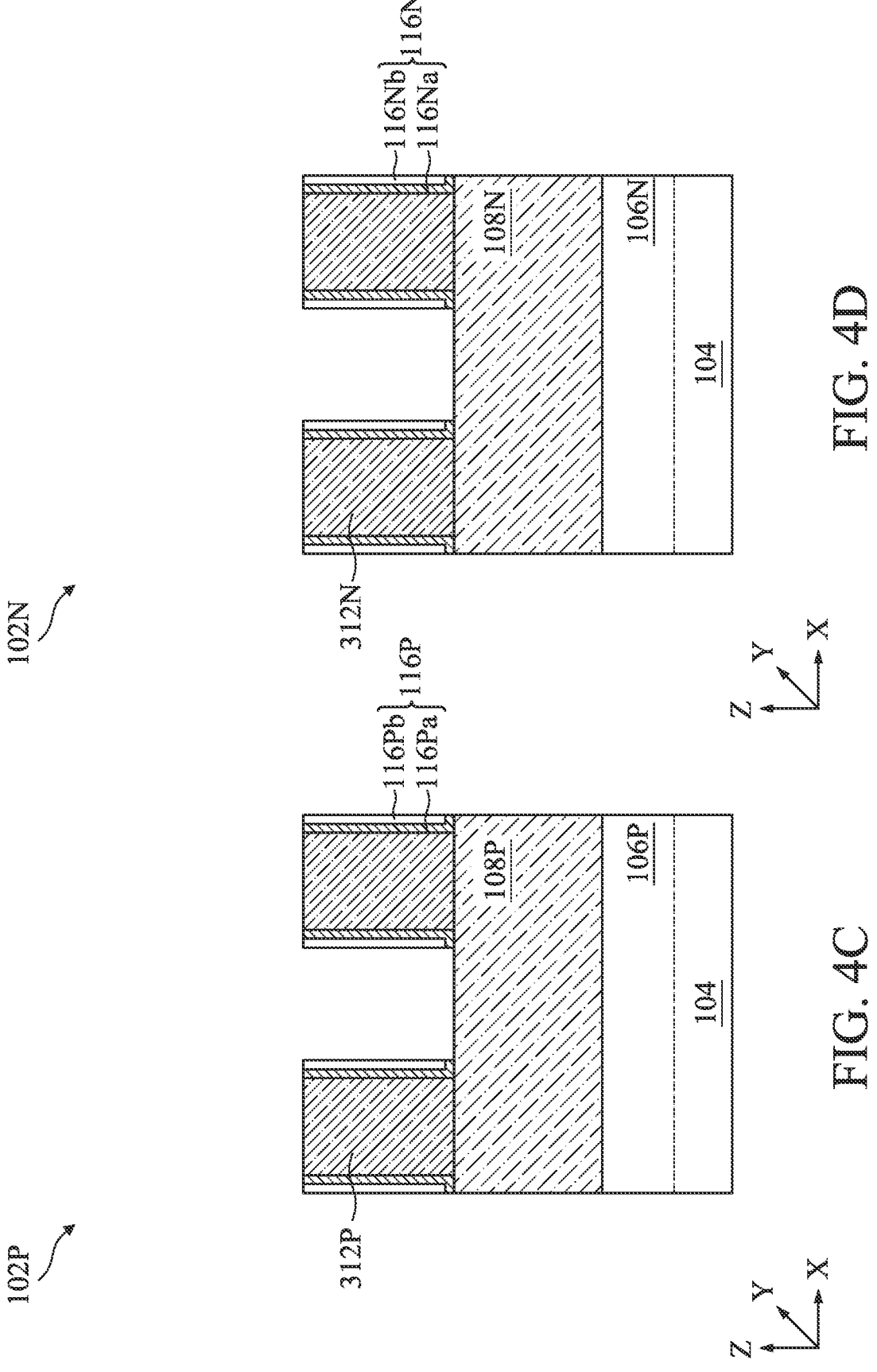
Figures 5A, 5B:
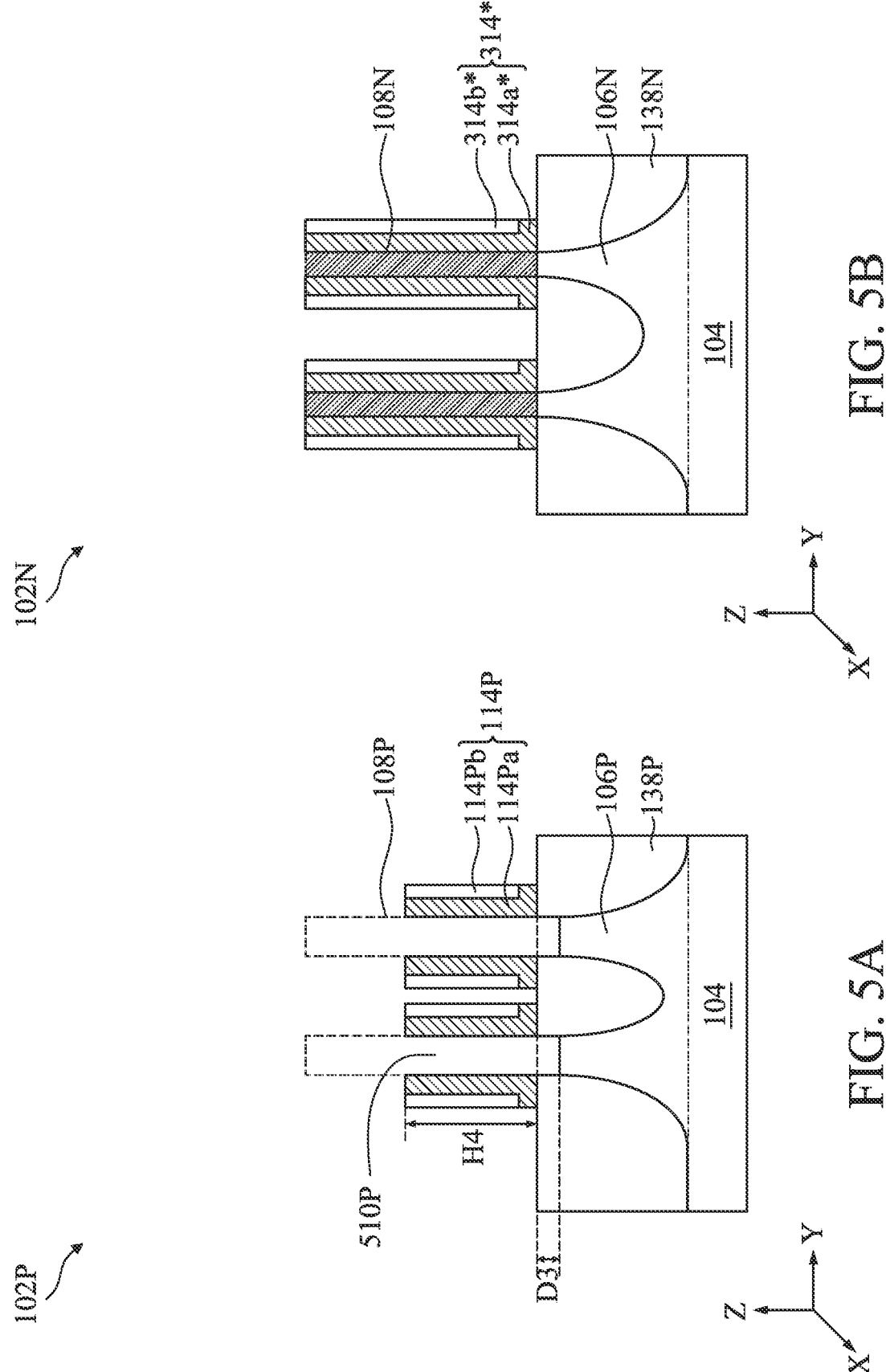
Figures 5C, 5D:
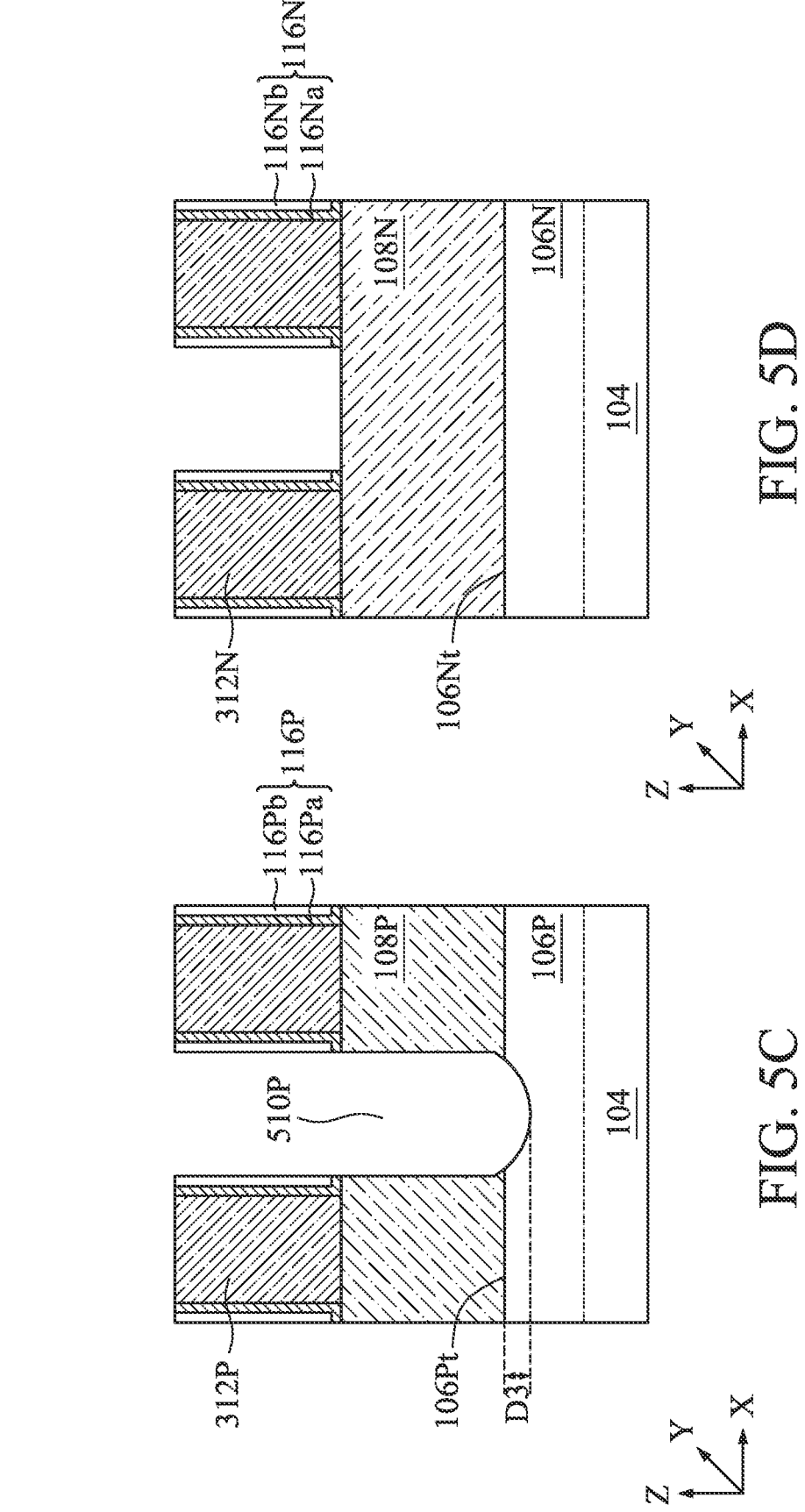

The first etching process can be followed by a second etching process to selectively etch portions of spacer portions 314* in PFET 102P of FIG. 4A to form S/D spacers 114P and selectively etch portions of fin structures 108P and fin bases 106P from the structures of FIGS. 4A and 4C to form S/D openings 510P, as shown in FIGS. 5A and 5C. In some embodiments, during the second etching process, the top surfaces of polysilicon structures 312P, the top surfaces of gate spacers 114P, and NFEPT 102N can be protected with a masking layer (not shown) formed after the first etching process. In some embodiments, the second etching process can include a plasma-based dry etching process using etching gases, such as carbon tetrafluoride (CF$_4$), sulfur dioxide (SO$_2$), hexafluoroethane (C$_2$F$_6$), chlorine (Cl$_2$), nitrogen trifluoride (NF$_3$), sulfur hexafluoride (SF$_6$), and hydrogen bromide (HBr), with mixture gases, such as hydrogen (H$_2$), oxygen (O$_2$), nitrogen (N$_2$), and argon (Ar).

In some embodiments, height H4 of S/D spacers 114P can be tuned by adjusting the second etching process conditions, such as the etch selectivity of the etching gases for fin structures 108P, fin bases 106P and spacer portions 314*, the flow rate of the etching gases, and the bias voltage of the plasma. In some embodiments, the etching gases used in the second etching process can have a higher selectivity for fin structures 108P and fin bases 106P than for spacer portions 314* to remove fin structures 108P and fin bases 106P at a higher etching rate than spacer portions 314*. As a result, at the end of the second etching process, the portions of fin structures 108P not covered by polysilicon structures 312P can be fully removed and portions of fin bases 106P under the etched portions of fin structures 108P can be recessed by distance D3 to form S/D openings 510P. And, S/D spacers 114 can remain to control the epitaxial lateral growth of subsequently-formed S/D regions 110P. The portions of fin bases 106P under the etched portions of fin structures 108P can be etched to ensure the complete removal of fin structures 108P in S/D openings 510P.

Figures 6A, 6B:
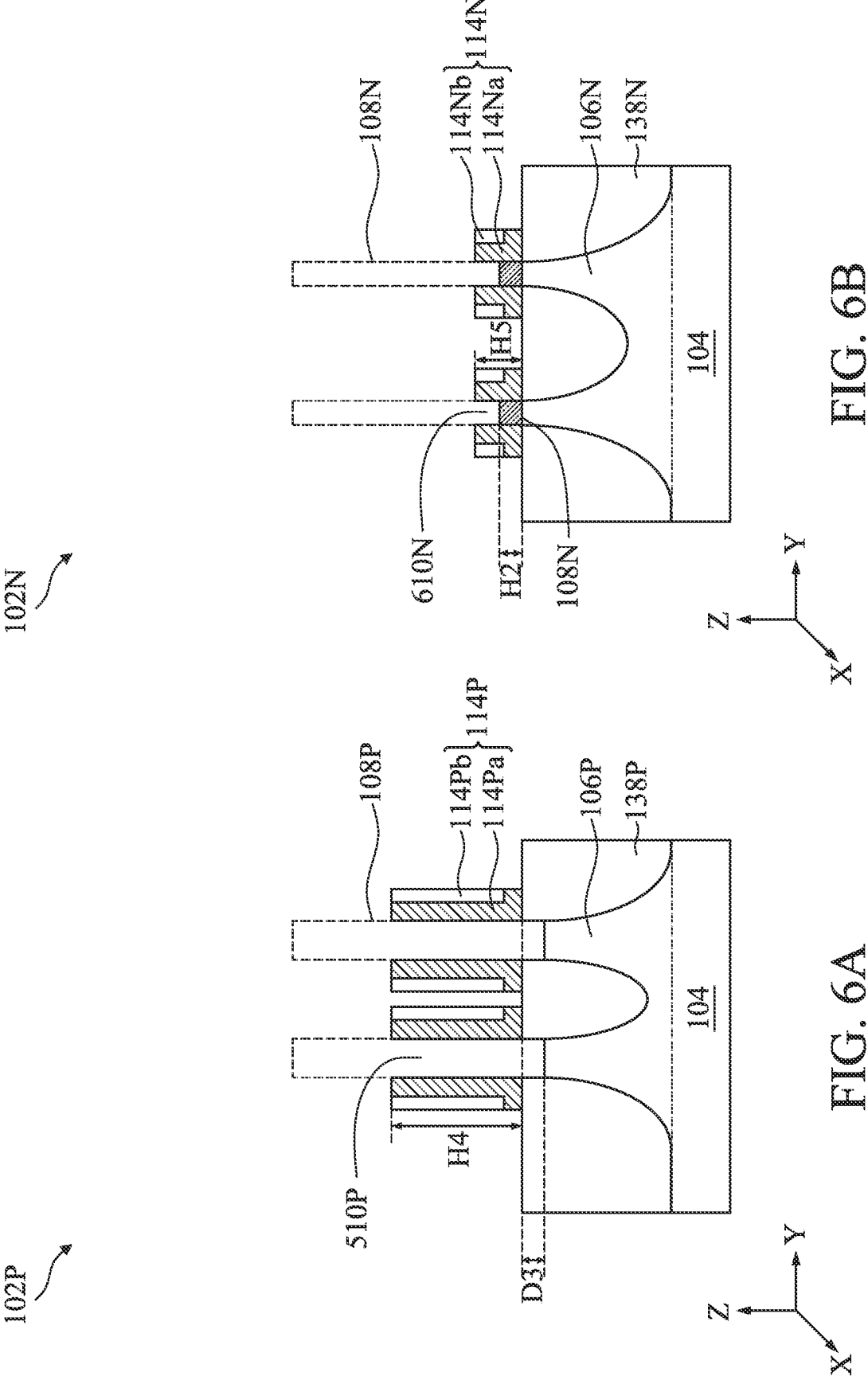
Figures 6C, 6D:
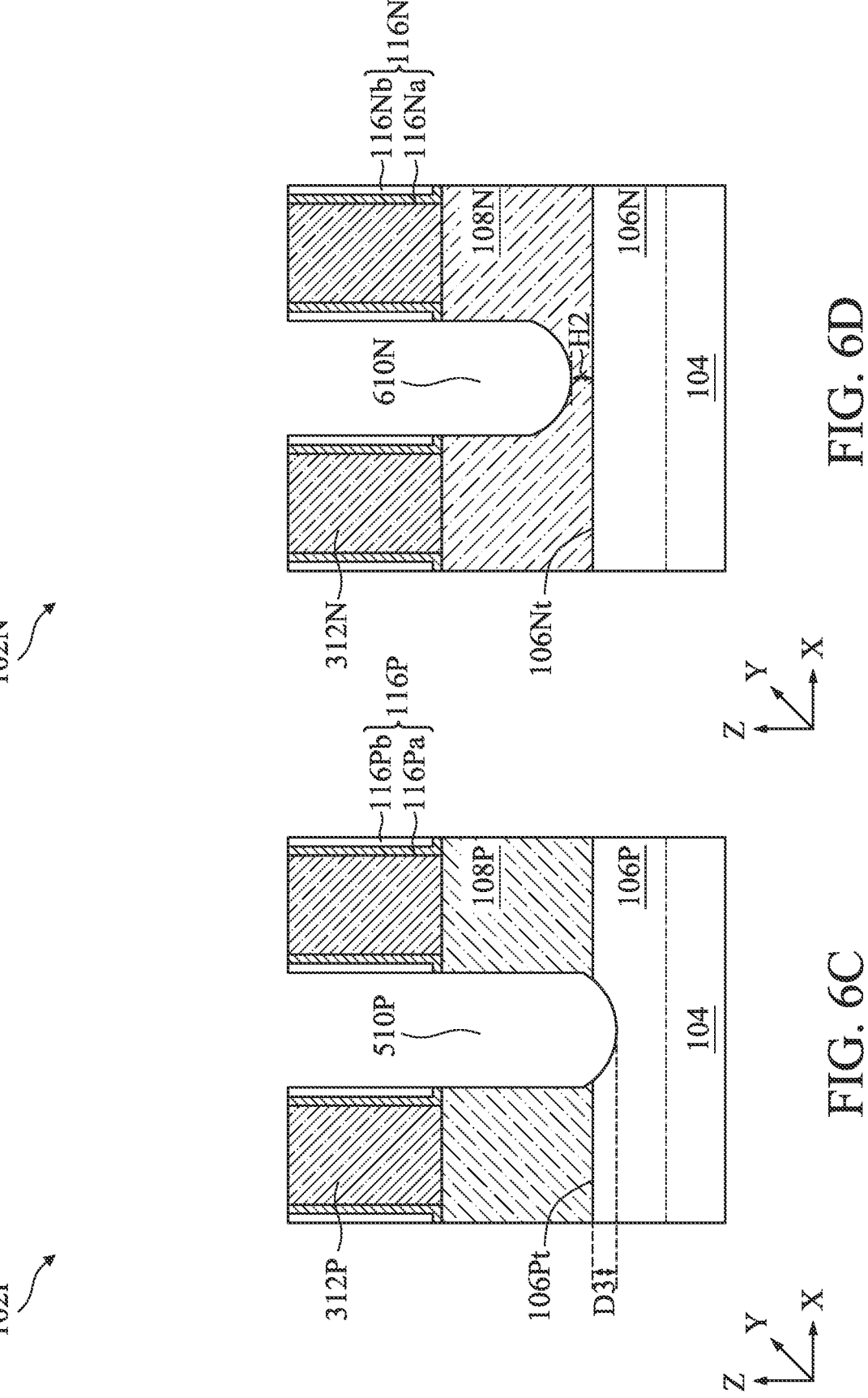

The second etching process can be followed by a third etching process to selectively etch portions of spacer portions 314* in NFET 102N of FIG. 5B to form S/D spacers 114N and selectively etch portions of fin structures 108N from the structures of FIGS. 5B and 5D to form S/D openings 610N, as shown in FIGS. 6B and 6D. In some embodiments, during the third etching process, the top surfaces of polysilicon structures 312N, the top surfaces of gate spacers 114N, and PFEPT 102P can be protected with a masking layer (not shown) formed after the second etching process. In some embodiments, the third etching process can include a plasma-based dry etching process using etching gases, such as carbon tetrafluoride (CF$_4$), sulfur dioxide $(SO_2)$, hexafluoroethane $(C_2F_6)$, chlorine $(Cl_2)$, nitrogen trifluoride $(NF_3)$, sulfur hexafluoride $(SF_6)$, and hydrogen bromide (HBr), with mixture gases, such as hydrogen $(H_2)$, oxygen $(O_2)$, nitrogen $(N_2)$, and argon (Ar).

In some embodiments, height H5 of S/D spacers 114N and height H2 of fin structures 108N can be tuned by adjusting the third etching process conditions, such as the etch selectivity of the etching gases for fin structures 108N and spacer portions 314*, the flow rate of the etching gases, and the bias voltage of the plasma. In some embodiments, the etching gases used in the third etching process can have a higher selectivity for fin structures 108N than for spacer portions 314* to remove fin structures 108N at a higher etching rate than spacer portions 314*. As a result, at the end of the third etching process, larger portions of fin structures 108N not covered by polysilicon structures 312P can be removed to form S/D openings 610N than the portions of spacer portions 314*, which form S/D spacers 114N to control the epitaxial lateral growth of subsequently-formed S/D regions 110N.

Referring to FIG. 2, in operation 215, S/D regions are formed in the S/D openings. For example, as described with reference to FIGS. 7A-8D, S/D regions 110P are formed in S/D openings 510P and S/D regions 110N are formed in S/D openings 610N. In some embodiments, S/D regions 110P and 110N can be sequentially formed in different processing steps. In some embodiments, the formation of S/D regions 110P can be followed by the formation of S/D regions 110N and vice versa.

Figures 7A, 7B:
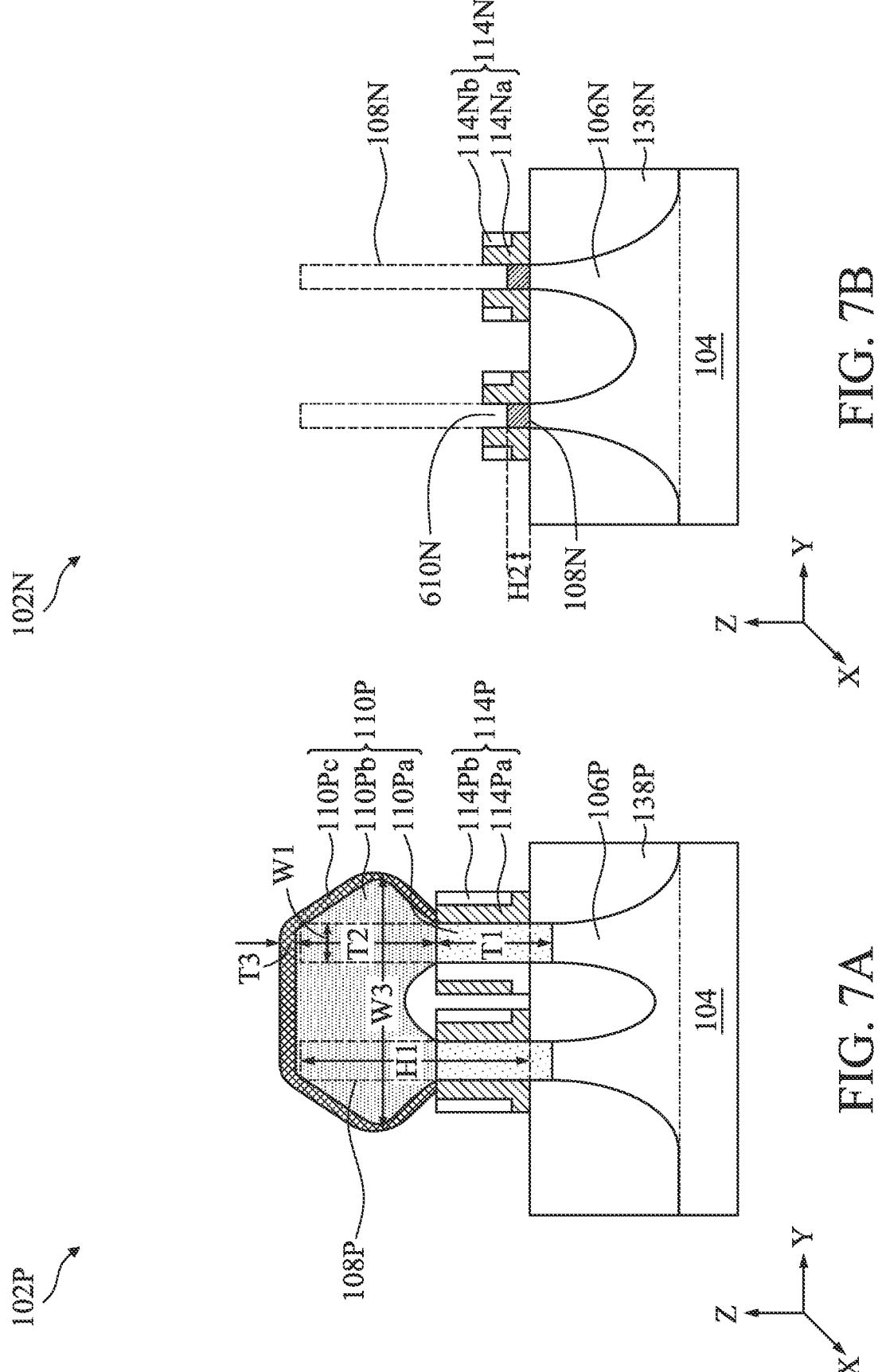
Figures 7C, 7D:
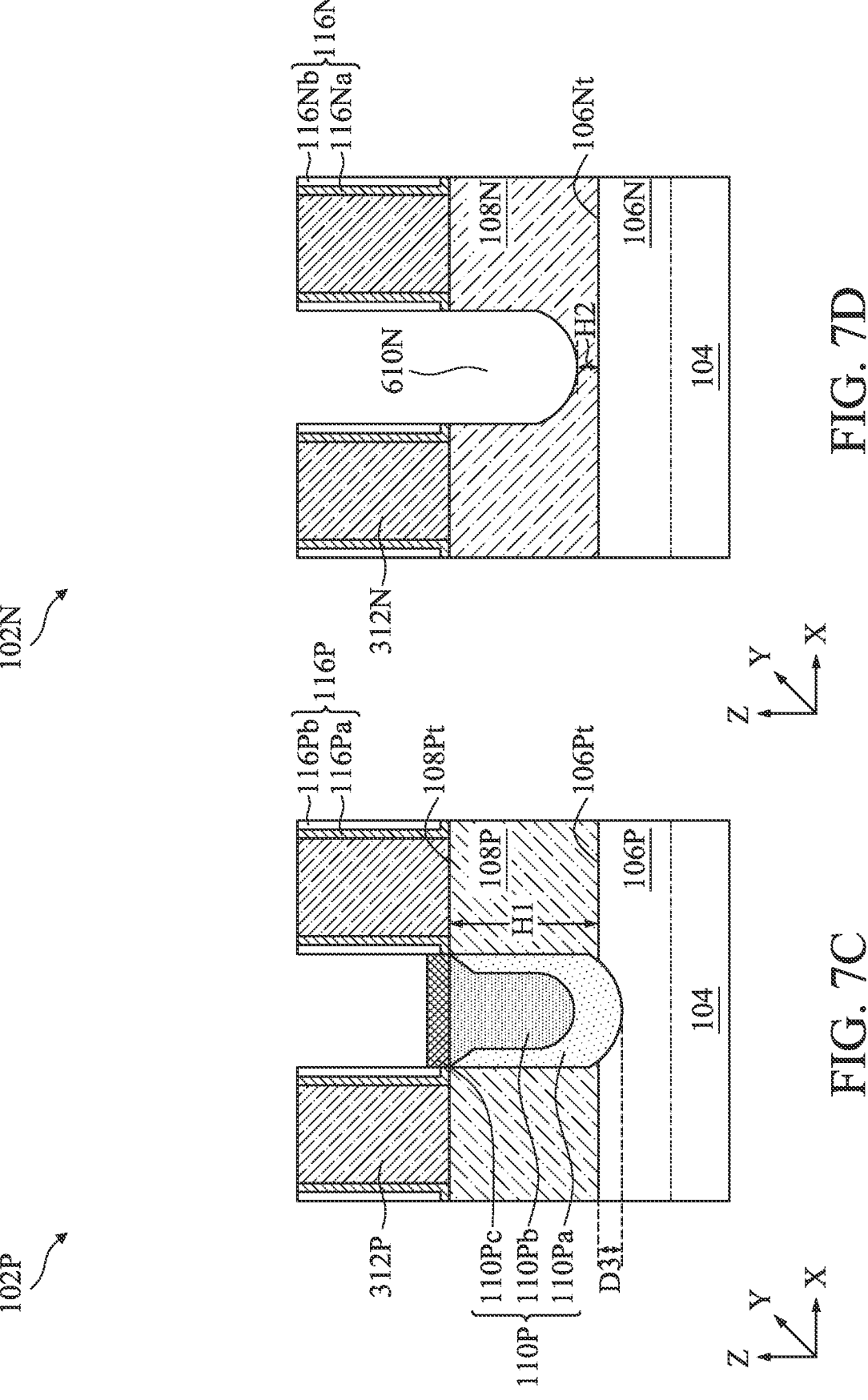

The formation of S/D region 110P can include sequential operations of (i) forming a masking layer (not shown) on the structures of NFET 102N shown in FIGS. 6B and 6D, (ii) forming epitaxial S/D sub-regions 110Pa on fin bases 106P in S/D openings 510P, as shown in FIGS. 7A and 7C, (iii) forming epitaxial S/D sub-region 110Pb on S/D sub-regions 110Pa, as shown in FIGS. 7A and 7C, and (iv) forming epitaxial S/D sub-region 110Pc on S/D sub-regions 110Pb, as shown in FIGS. 7A and 7C.

The formation of S/D sub-regions 110Pa can include performing a deposition process using precursors, such as dichlorosilane (DCS) and $SiH_4$ as Si precursors, germane $(GeH_4)$ as a Ge precursor, diborane $(B_2H_6)$ as a p-type dopant, and Hz at a temperature of about 600° C. to about 700° C. under a pressure from about 10 torr to about 50 torr.

The formation of S/D sub-regions 110Pb can include a first cycle of a deposition process and an etching process. The deposition process can include using precursors, such as DCS as a Si precursor, $GeH_4$ as a Ge precursor, $B_2H_6$ as a p-type dopant precursor, and $H_2$. The Si precursor can include DCS without $SiH_4$ for a control of dopant concentration. In some embodiments, the deposition process can be performed at a temperature of about 600° C. to about 700° C. under a pressure from about 10 torr to about 50 torr. The deposition process can have a linear ramping of dopant precursor flow rate to form a gradient doping in S/D sub-regions 110Pb. The etching process can include using etching gas HCl at a temperature of about 600° C. to about 700° C. under a pressure from about 10 torr to about 50 torr. In some embodiments, the first cycle of deposition process and the etching process for forming S/D sub-regions 110Pb can be repeated.

The formation of S/D sub-regions 110Pc can include a second cycle of a deposition process and an etching process. The deposition process can include using precursors, such as DCS as a Si precursor, $GeH_4$ as a Ge precursor, $B_2H_6$ as a p-type dopant precursor, and $H_2$. The deposition process can have a constant gas ratio among the precursors. In some embodiments, the deposition process can be performed at a temperature of about 600° C. to about 700° C. under a pressure from about 10 torr to about 50 torr. In some embodiments, the etch process can include using etching gases HCl and $GeH_4$ at a temperature of about 600° C. to about 700° C. under a pressure from about 5 torr to about 50 torr. In some embodiments, the second cycle of deposition process and the etching process for forming S/D sub-regions 110Pc can be repeated.

Figures 8A, 8B:
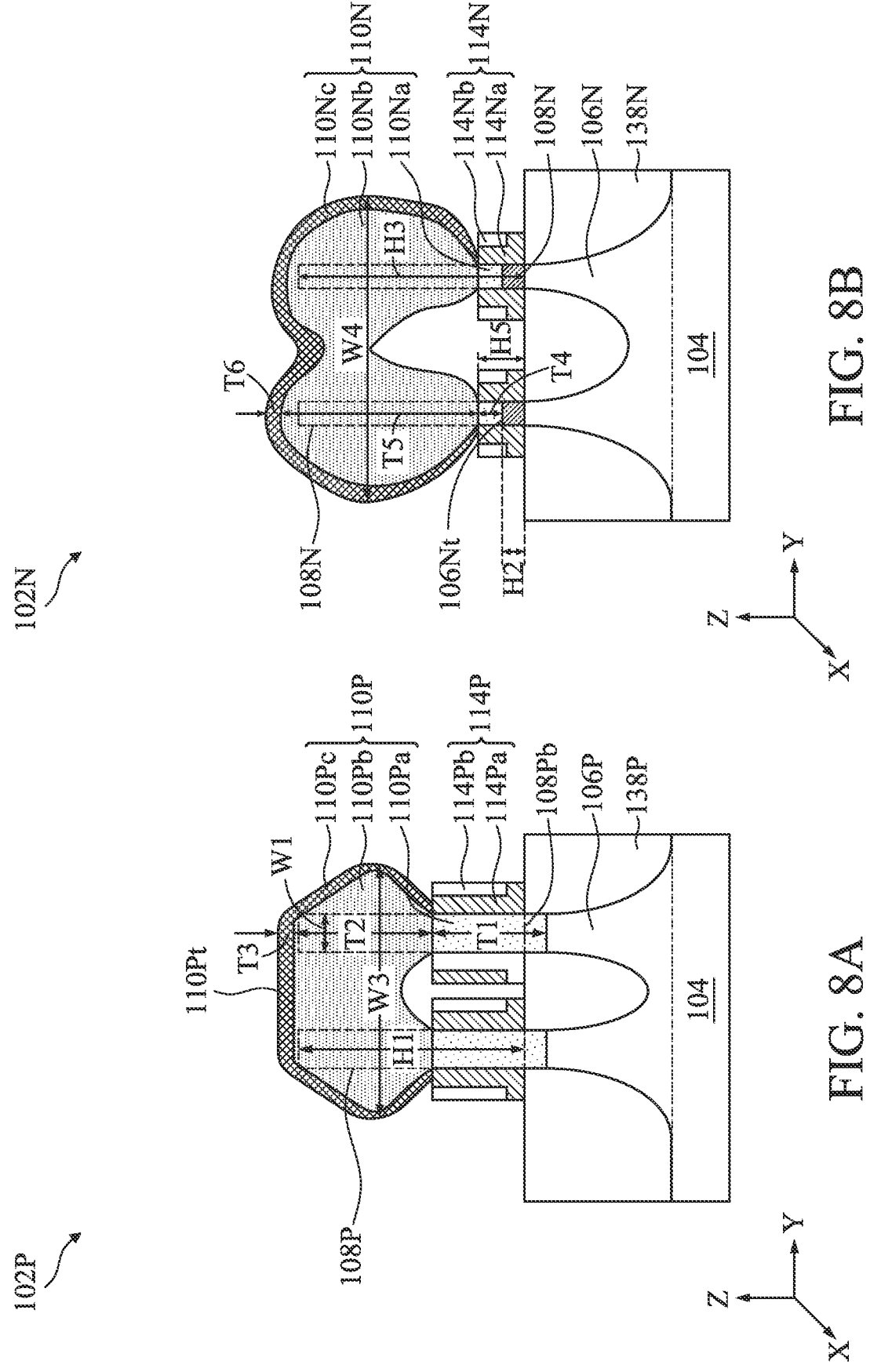
Figures 8C, 8D:
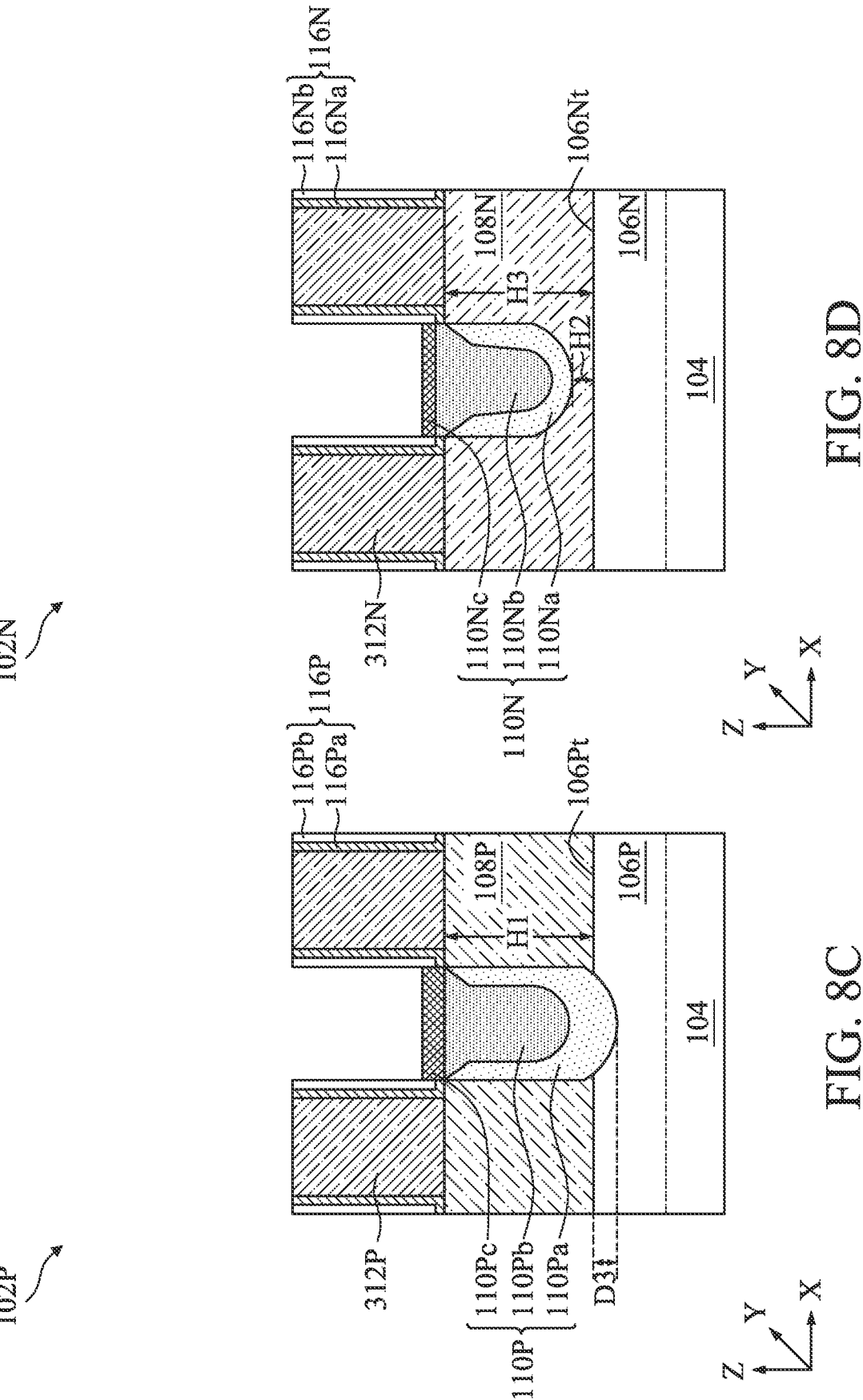
Figures 9A, 9B:
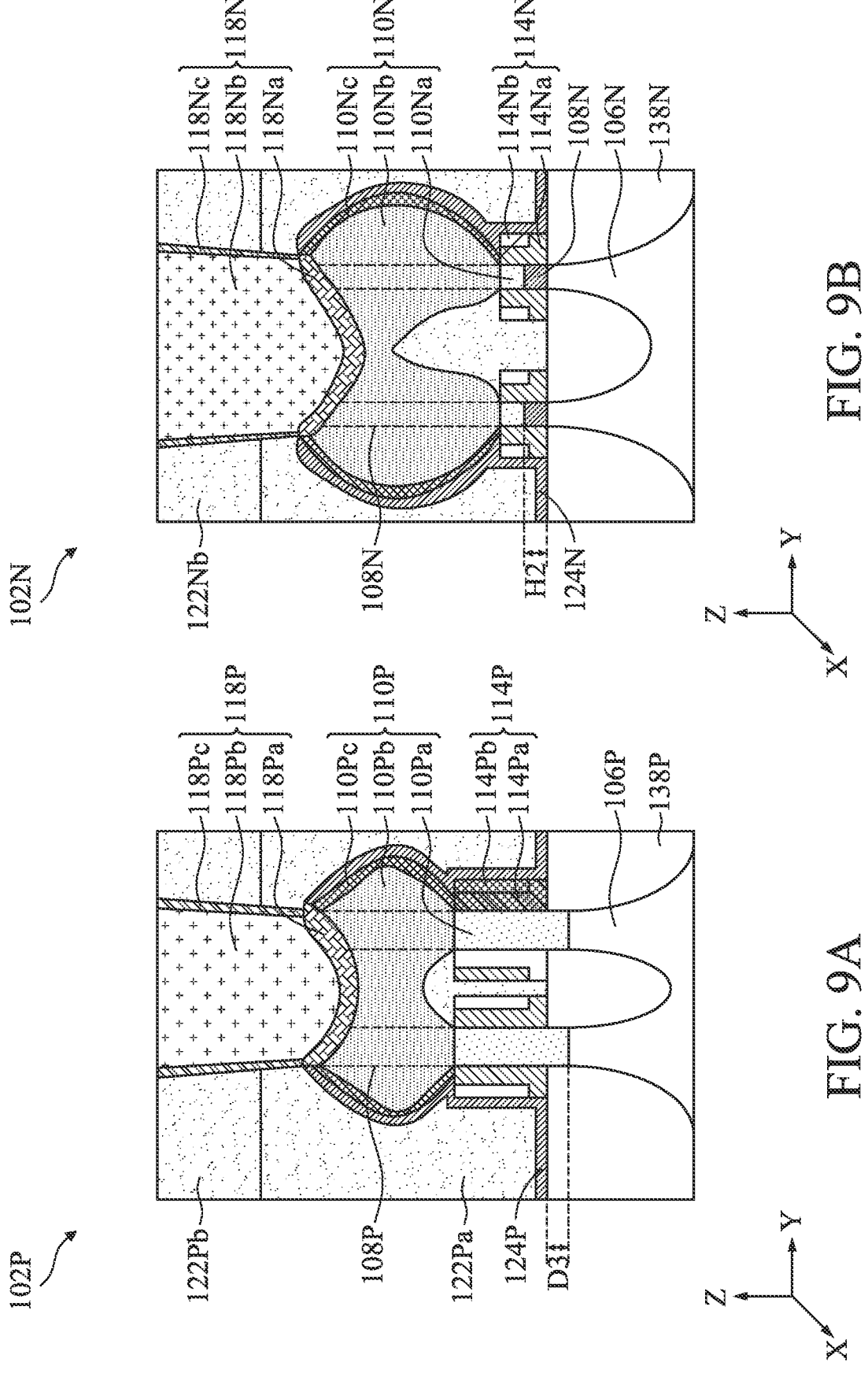
Figures 9C, 9D:
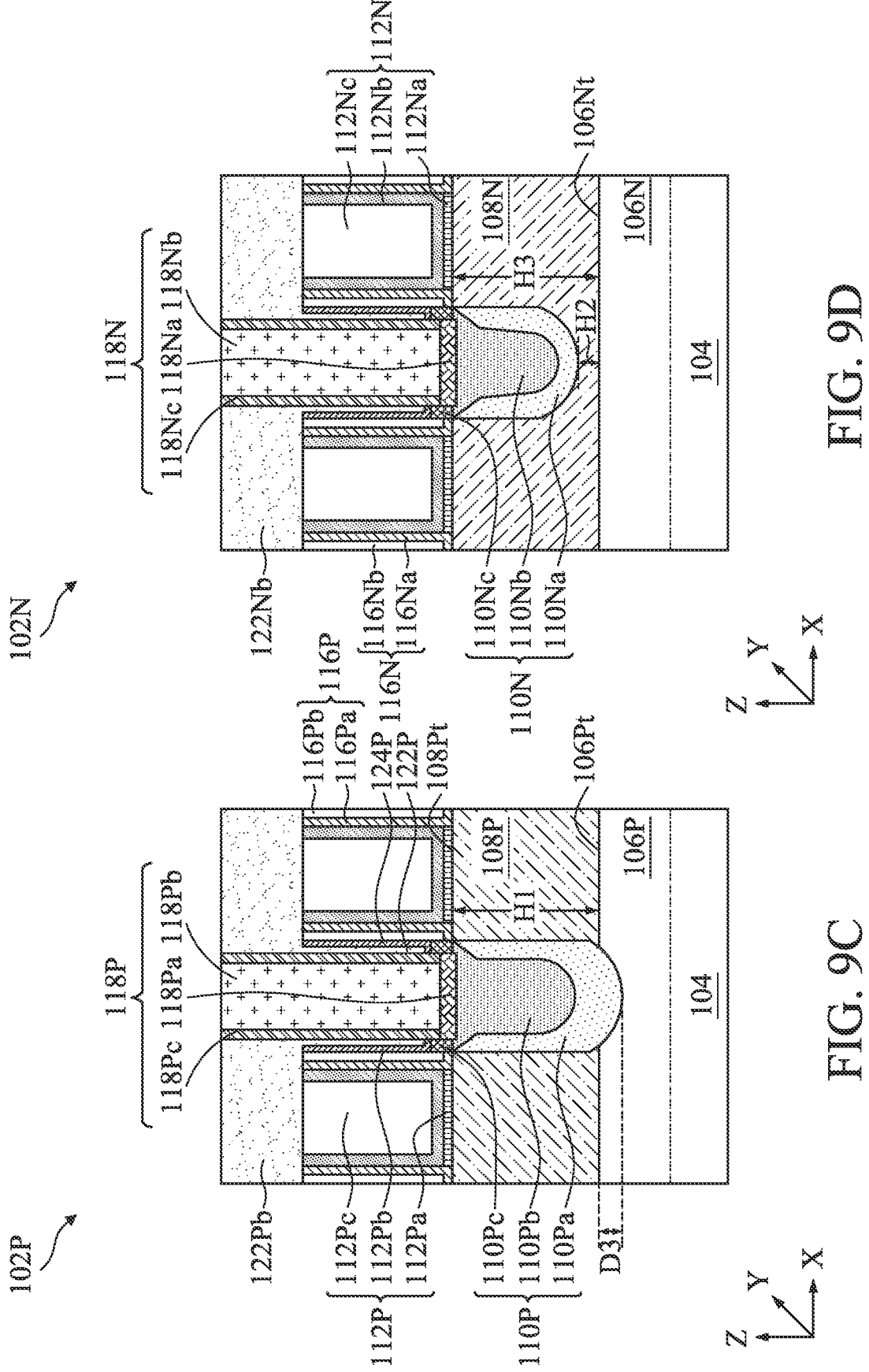

The formation of S/D region 110N can include sequential operations of (i) forming a masking layer (not shown) on the structures of PFET 102P shown in FIGS. 7B and 7D, (ii) forming epitaxial S/D sub-regions 110Na on fin structures 108N in S/D openings 610N, as shown in FIGS. 8B and 8D, (iii) forming epitaxial S/D sub-region 110Nb on S/D sub-regions 110Na, as shown in FIGS. 8B and 8D, and (iv) forming epitaxial S/D sub-region 110Nc on S/D sub-regions 110Nb, as shown in FIGS. 8B and 8D.

The formation of S/D sub-regions 110Na can include performing a deposition process using precursors, such as DCS or $SiH_4$ as a Si precursor, phosphine $(PH_3)$ as an n-type dopant, and $H_2$ at a temperature of about 650° C. to about 750° C. under a pressure from about 10 torr to about 600 torr.

The formation of S/D sub-regions 110Nb can include a first cycle of a deposition process and an etching process. The deposition process can include using precursors, such as $SiH_4$ as a Si precursor, $PH_3$ as an n-type dopant, and $H_2$. In some embodiments, the deposition process can be performed at a temperature of about 650° C. to about 750° C. under a pressure from about 10 torr to about 600 torr. A ratio of the flow rate of $SiH_4$ to the flow rate of $PH_3$ in the deposition process can range from about 1 to about 4. The etching process can include using etching gases HCl and $SiH_4$ at a temperature of about 650° C. to about 750° C. under a pressure from about 10 torr to about 500 torr. A ratio of the flow rates of $SiH_4$ to HCl can range from about 20% to about 80%. In some embodiments, the first cycle of deposition process and the etching process for forming S/D sub-regions 110Nb can be repeated.

The formation of S/D sub-regions 110Nc can include a second cycle of a deposition process and an etching process. The deposition process can include using precursors, such as DCS as a Si precursor, $PH_3$ as an n-type dopant, and $H_2$. In some embodiments, the deposition process can be performed at a temperature of about 650° C. to about 750° C. under a pressure from about 10 torr to about 600 torr. In some embodiments, the etch process can include using etching gases HCl and $GeH_4$ at a temperature of about 700° C. to about 780° C. under a pressure from about 5 torr to about 50 torr. A ratio of the flow rates of HCl to $GeH_4$ can range from about 2 to about 5. In some embodiments, the second cycle of deposition process and the etching process for forming S/D sub-regions 110Nc can be repeated.

The formation of S/D region 110N can be followed by the formation of ILD layers 122Pa and 122Na and ESLs 124P and 124N.

Referring to FIG. 2, in operation 220, the polysilicon structures are replaced with gate structures and contact structures are formed on the S/D regions. For example, as described with reference to FIGS. 9A-9D, polysilicon structures 312P and 312N are replaced with gate structures 112P and 112N, respectively, and contact structures 118P and 118N are formed on S/D regions 110P and 110N, respectively. In some embodiments, the formation of gate structures 112P and 112N can be followed by the formation of ILD layers 122Pb and 112Nb, which can be followed by the formation of contact structures 118P and 118N.

The present disclosure provides example semiconductor devices (e.g., semiconductor device 100) with PFETs (e.g., PFET 102P) and NFETs (e.g. NFET 102N) having p-type and n-type S/D regions (e.g., S/D regions 110P and 110N), respectively, of substantially similar heights and larger dimensions. The present disclosure also provides example methods (e.g., method 200) to fabricate the semiconductor devices. In some embodiments, the PFET can include a diamond-shaped p-type S/D region (e.g., S/D region 111P) disposed on a fin base and the NFET can include an oval-shaped n-type S/D region (e.g., 111N) disposed on another fin base. In some embodiments, the PFET and NFET can include merged p- and n-type S/D regions (e.g., merged S/D regions 110P and 110N) disposed on a pair of fin bases (e.g., fin bases 106P and 106N), respectively. The p- and n-type S/D regions can be formed with top surfaces at substantially similar heights from the substrate of the semiconductor device. In some embodiments, the height difference between the top surfaces of the p- and n-type S/D regions can be equal to or less than about 5 nm.

In some embodiments, the p-type S/D region can be formed with a width (e.g., width W3) of about 55 nm to about 70 nm and the n-type S/D region can be formed with a width (e.g., width W4) of about 60 nm to about 75 nm for adequate electrical contact between the top surfaces and the contact structures on the p- and n-type S/D regions. To achieve similar device characteristics (e.g., similar threshold voltages) in the PFET and NFET, the width of the n-type S/D region can be formed greater than that of the p-type S/D region. In some embodiments, the ratio of the widths of the n- and p-type S/D regions can be about 1.1 to about 2. In some embodiments, the widths of the merged S/D regions can depend on the spacings between the underlying pairs of fin bases. For example, to form the wider merged n-type S/D region, the fin bases under the merged n-type S/D region can be spaced apart at a distance (e.g., distance D2) greater than a distance (e.g., distance D1) between the fin bases under the merged p-type S/D region.

In some embodiments, the PFET and NFET can further include S/D spacers (e.g., S/D spacers 114P and 114N) formed along sidewalls of the S/D regions. The S/D spacers can include a dielectric material and can control the height and lateral epitaxial growth of the S/D regions. In some embodiments, the S/D spacers can limit the lateral epitaxial growth ("lateral extension") on each side of the S/D regions to a lateral dimension of about 10 nm to about 20 nm to prevent the S/D regions from merging with adjacent S/D regions during their epitaxial growth process. In some embodiments, the wider n-type S/D region can have a lateral extension on each side greater (e.g., about 1 nm to about 10 nm greater) than that of the p-type S/D region. To form the n- and p-type S/D regions with such relative dimensions and with the S/D region top surfaces at substantially similar heights from the substrate, the S/D spacers along the n-type S/D region are formed with a height (e.g., height H5) shorter (e.g., about 5 nm to about 10 nm shorter) than a height (e.g., height H4) of the S/D spacers along the p-type S/D region.

In some embodiments, a semiconductor device includes a substrate, a first FET, and a second FET. The substrate includes first and second substrate regions. The first FET includes first and second fin bases disposed on the first substrate region, first and second fin structures disposed on the first and second fin bases, respectively, a first S/D region disposed on the first and second fin bases and in contact with side surfaces of the first and second fin structures, and a first pair of spacers disposed on opposite sidewalls of the first S/D region. The second FET includes third and fourth fin bases disposed on the second substrate region, third and fourth fin structures disposed on the third and fourth fin bases, respectively, a second S/D region disposed on the third and fourth fin structures, and a second pair of spacers disposed on opposite sidewalls of the second S/D region. A height of the first pair of spacers is greater than a height of the second pair of spacers.

In some embodiments, a semiconductor device includes a substrate, a first FET, and a second FET. The substrate includes first and second substrate regions. The first FET includes a first fin base disposed on the first substrate region, a first fin structures disposed on the first fin base, a first source/drain (S/D) region disposed on the first fin base, and a first pair of spacers disposed on opposite sidewalls of the first S/D region. The second FET includes a second fin base disposed on the second substrate region, a second fin structure disposed on the second fin base, a second S/D region disposed on the second fin structure, and a second pair of spacers disposed on opposite sidewalls of the second S/D region. A height of the first pair of spacers is greater than a height of the second pair of spacers.

In some embodiments, a method includes forming first and second fin structures on first and second fin bases, respectively, on a substrate, forming third and fourth fin structures on third and fourth fin bases, respectively, on the substrate, depositing a dielectric layer on the first, second, third, and fourth fin structures, forming first S/D openings on the first and second fin bases and adjacent to the first and second fin structures, etching a first portion of the dielectric layer to form first spacers on sidewalls of the first openings, forming second S/D openings on the third and fourth fin structures, etching a second portion of the dielectric layer to form second spacers on sidewalls of the second S/D openings, forming a first merged S/D region in the first S/D openings, and forming a second merged S/D region in the second S/D openings.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate comprising first and second substrate regions;
   a first field effect transistor (FET), comprising:
      first and second fin bases disposed on the first substrate region,
      first and second fin structures disposed on the first and second fin bases, respectively,
      a first source/drain (S/D) region in contact with top surfaces of the first and second fin bases and in contact with side surfaces of the first and second fin structures, and
      a first pair of spacers disposed on opposite sidewalls of the first S/D region; and
   a second FET, comprising:

third and fourth fin bases disposed on the second substrate region;

third and fourth fin structures disposed on the third and fourth fin bases, respectively;

a second S/D region in contact with top surfaces of the third and fourth fin structures; and a second pair of spacers disposed on opposite sidewalls of the second S/D region, wherein a height of the first pair of spacers is greater than a height of the second pair of spacers.

2. The semiconductor device of claim 1, wherein a distance between the first and second fin structures is less than a distance between the third and fourth fin structures.

3. The semiconductor device of claim 1, wherein widths of the first and second fin structures are greater than widths of the third and fourth fin structures.

4. The semiconductor device of claim 1, wherein a first merged region of the first S/D region extends above the first pair of spacers and a second merged region of the second S/D region extends above the second pair of spacers, and wherein a thickness of the second merged region is greater than a thickness of the first merged region.

5. The semiconductor device of claim 4, wherein a ratio of a width of the second merged region to a width of the first merged region is about 1.1 to about 2.

6. The semiconductor device of claim 1, wherein a distance between top ends of the first and second fin structures is greater than a distance between bottom ends of the first and second fin structures; and wherein a distance between top ends of the third and fourth fin structures is less than a distance between bottom ends of the third and fourth fin structures.

7. The semiconductor device of claim 1, wherein the second pair of spacers is disposed on opposite sidewalls of the third fin structure.

8. The semiconductor device of claim 1, wherein a difference between the height of the first pair of spacers and the height of the second pair of spacers is about 5 nm to about 10 nm.

9. The semiconductor device of claim 1, wherein the first S/D region has p-type dopants and the second S/D region has n-type dopants.

10. The semiconductor device of claim 1, wherein the third and fourth fin structures comprise undoped semiconductor materials.

11. A semiconductor device, comprising:

a substrate comprising first and second substrate regions;

a first field effect transistor (FET), comprising:

a first fin base disposed on the first substrate region, a first fin structures disposed on the first fin base, a first source/drain (S/D) region disposed on the first fin base, and a first pair of spacers disposed on opposite sidewalls of the first S/D region; and a second FET, comprising:

a second fin base disposed on the second substrate region;

a second fin structure disposed on the second fin base, wherein the second fin structure comprises an undoped semiconductor material;

a second S/D region disposed on the second fin structure; and a second pair of spacers disposed on opposite sidewalls of the second S/D region, wherein a height of the first pair of spacers is greater than a height of the second pair of spacers.

12. The semiconductor device of claim 11, wherein the first S/D region comprises a diamond-shaped region above the first pair of spacers; and wherein the second S/D region comprises an oval-shaped region above the second pair of spacers.

13. The semiconductor device of claim 12, wherein a width of the diamond-shaped region is greater than a width of the oval-shaped region.

14. The semiconductor device of claim 11, wherein a width of the first fin structure is greater than a width of the second fin structure.

15. The semiconductor device of claim 11, wherein a difference between the height of the first pair of spacers and the height of the second pair of spacers is about 5 nm to about 10 nm.

16. The semiconductor device of claim 11, wherein the first S/D region has p-type dopants and the second S/D region has n-type dopants.

17. A method, comprising:

forming first and second fin structures on first and second fin bases, respectively, on a substrate;

forming third and fourth fin structures on third and fourth fin bases, respectively, on the substrate;

depositing a dielectric layer on the first, second, third, and fourth fin structures;

forming first source/drain (S/D) openings on the first and second fin bases and adjacent to the first and second fin structures, wherein forming the first S/D openings comprises:

etching portions of the first and second fin structures, and etching portions of the first and second fin bases under the portions of the first and second fin structures;

etching a first portion of the dielectric layer to form first spacers on sidewalls of the first openings;

forming second S/D openings on the third and fourth fin structures;

etching a second portion of the dielectric layer to form second spacers on sidewalls of the second S/D openings;

forming a first merged S/D region in the first S/D openings; and forming a second merged S/D region in the second S/D openings.

18. The method of claim 17, wherein the first spacers are formed with a first height and the second spacers are formed with a second height, and wherein the first height is greater than the second height.

19. The method of claim 17, wherein forming the second S/D openings comprises etching portions of the third and fourth fin structures from a first height to a second height, wherein the second height is less than a height of the second spacers.

20. The method of claim 17, wherein forming first and second fin structures on first and second fin bases, respectively, comprises:

epitaxially growing a semiconductor layer on the substrate;

etching the semiconductor layer to form the first and second fin structures; and etching portions of the substrate under the first and second fin structures to form the first and second fin bases.

* * * * *